United States Patent
San et al.

(10) Patent No.: US 7,227,482 B2
(45) Date of Patent: Jun. 5, 2007

(54) COMPLEX BAND-PASS FILTER FOR USE IN DIGITAL RADIO RECEIVER AND COMPLEX BAND-PASS Δ-Σ AD MODULATOR USING THE SAME

(75) Inventors: Hao San, Gunma (JP); Haruo Kobayashi, Gunma (JP); Hiroki Wada, Gunma (JP); Akira Hayakawa, Gunma (JP); Hiroyuki Hagiwara, Gunma (JP); Yoshitaka Jingu, Gunma (JP); Kazuyuki Kobayashi, Gunma (JP); Toshiro Tsukada, Tokyo (JP)

(73) Assignee: Semiconductor Technology Academic Research Center, Yokohama-shi (JP)

( * ) Notice: Subject to any disclaimer, the term of this patent is extended or adjusted under 35 U.S.C. 154(b) by 0 days.

(21) Appl. No.: 11/408,941

(22) Filed: Apr. 24, 2006

(65) Prior Publication Data

US 2006/0284751 A1 Dec. 21, 2006

(30) Foreign Application Priority Data

Jun. 15, 2005 (JP) ............................ P2005-175242

(51) Int. Cl.
*H03M 3/00* (2006.01)
(52) U.S. Cl. ...................... 341/143; 341/141; 375/247
(58) Field of Classification Search ................ 341/143, 341/141; 333/17.1; 375/324, 344, 247, 375/269, 316, 332, 345, 346, 206; 708/819; 329/315; 324/640
See application file for complete search history.

(56) References Cited

U.S. PATENT DOCUMENTS

| | | | | | |
|---|---|---|---|---|---|
| 4,300,229 | A | * | 11/1981 | Hirosaki | 370/206 |
| 4,635,004 | A | * | 1/1987 | Ishigaki | 332/170 |
| 4,847,872 | A | * | 7/1989 | Hespelt et al. | 375/344 |
| 5,757,862 | A | * | 5/1998 | Ishizu | 375/324 |
| 6,160,859 | A | * | 12/2000 | Martin et al. | 375/345 |
| 6,218,972 | B1 | * | 4/2001 | Groshong | 341/143 |

(Continued)

FOREIGN PATENT DOCUMENTS

JP       5-275972       10/1993

(Continued)

OTHER PUBLICATIONS

Crols et al., IEEE Transactions on Circuits and Systems Analog and Digital Signal Processing, vol. 45, No. 3, pp. 269-282 (Mar. 1998).

(Continued)

*Primary Examiner*—Jean Bruner Jeanglaude
(74) *Attorney, Agent, or Firm*—Birch, Stewart, Kolasch and Birch, LLP

(57) ABSTRACT

In a first-order complex band-pass filter, multiplexers are alternately switched over between time intervals of phases A and B, where the multiplexers includes two multiplexers provided at input and output stages, and a multiplexer provided in a feedback circuit of each of first-order filters and being switching over whether to invert a sign of a feedback signal. Then in a circuit part sandwiched between the multiplexers, a processing performed by an I circuit part and a processing performed by a Q circuit part are alternately switched over so that a sign of a signal inputted to an adder is inverted.

20 Claims, 20 Drawing Sheets

U.S. PATENT DOCUMENTS

| | | | |
|---|---|---|---|
| 6,225,928 B1* | 5/2001 | Green | 341/143 |
| 6,232,902 B1 | 5/2001 | Wada | |
| 6,243,430 B1* | 6/2001 | Mathe | 375/346 |
| 6,317,468 B1* | 11/2001 | Meyer | 375/269 |
| 6,339,621 B1* | 1/2002 | Cojocaru et al. | 375/247 |
| 6,590,943 B1* | 7/2003 | Ali | 375/332 |
| 6,683,919 B1* | 1/2004 | Olgaard et al. | 375/316 |
| 6,696,843 B1* | 2/2004 | Beneteau et al. | 324/640 |
| 6,819,274 B2* | 11/2004 | Krone et al. | 341/141 |
| 2004/0042539 A1* | 3/2004 | Vishakhadatta et al. | 375/216 |

FOREIGN PATENT DOCUMENTS

| | | |
|---|---|---|
| JP | 11-17549 | 1/1999 |
| JP | 2000-244323 A | 9/2000 |
| JP | 2002-100992 A | 4/2002 |

OTHER PUBLICATIONS

Munoz et al., IEEE International Solid-State Circuits Conference "A 4.7mW 89.5dB DR CT Complex $\Delta\Sigma$ ADC with Built-in LPF", ISSCC Digest of Technical Papers vol. 47, pp. 500-501 (Feb. 2005).

Yaghini et al., IEEE International Solid-State Circuits Conference,"A 43mW CT Complex $\Delta\Sigma$ ADC with 23MHz of Signal Band width and 68.6 SNDR", ISSCC Digest of Technical Papers, vol. 47, pp. 502-503 (Feb. 2005).

Jantzi et al., IEEE Journal of Solid-State Circuits, vol. 32, No. 12, pp. 1935-1950 (Dec. 1997).

Hayakawa et al., The Institute of Electronics Information and Communication Engineers, Technical Report of IEICE, pp. 1-6 (Jul. 2004).

San et al., An Element of Rotation Algorithm for Multi-bit DAC Nonlinearities in Complex Bandpass $\Delta\Sigma$AD Modulators, IEEE 17th International Confernece on VLSI Design, pp. 151-156, (Jan. 2004).

San et al., IEICE Trans. Fundamentals, vol. E87-A, No. 4, pp. 792-800 (Apr. 2004).

Wada et al., "Mapping from a DWA Algorithm into Circuit for Multi-bit Complex Band-pass $\Delta\Sigma$ AD Modulators", Report of Meeting of IEEJ (The Institute of Electrical Engineers of Japan) on Electronic Circuits, ECT-04-47 pp. 1-6 (Jun. 25, 2004).

Longo et al., IEEE Iternational Solid State Circuits Conference, pp. 226-227 (Feb. 1993).

Riches et al., IEEE Transactions on Circuits and Systems II, Analog and Digital Signal Processing, vol. 49, pp. 73-85 (Feb. 2002).

Breems et al., IEEE Journal of Solid-State Circuits, vol. 36, No. 12, pp. 1879-1886 (Dec. 2001).

Maurino et al., "Multibits Quadrature Sigma-Delta Modulator with DEM Schems", Proceedings of ISCAS, vol. 1, pp. 1136-1139 (May 2004).

Martin et al., IEEE Transactions of Circuits and Systems-1, vol. 51, pp. 1823-1836 (Sep. 2004).

Schreier et al., "Quadrature Mismatch-shaping", Proceedings of ISCAS, vol. 4, pp. 675-678 (May 2002).

* cited by examiner

Fig.17

| | I CIRCUIT PART | Q CIRCUIT PART |
|---|---|---|
| $C_{in}$ | $(1-0.023) \times 1$ | $(1-0.023) \times 1$ |
| $C_{out}$ | $(1+0.014) \times 3$ | $(1-0.028) \times 3$ |
| $C_{CP}$ | $(1-0.035) \times 3$ | $(1+0.028) \times 3$ |
| $C_{D0}$ | $(1-0.0004) \times 2$ | $(1-0.018) \times 2$ |
| $C_{D1}$ | $(1-0.0014) \times 2$ | $(1+0.014) \times 2$ |
| $C_{D2}$ | $(1+0.0018) \times 2$ | $(1+0.008) \times 2$ |
| $C_{D3}$ | $(1-0.0006) \times 2$ | $(1+0.014) \times 2$ |
| $C_{D4}$ | $(1+0.0012) \times 2$ | $(1+0.012) \times 2$ |
| $C_{D5}$ | $(1+0.0012) \times 2$ | $(1-0.006) \times 2$ |
| $C_{D6}$ | $(1-0.018) \times 2$ | $(1-0.024) \times 2$ |
| $C_{D7}$ | $(1-0.000) \times 2$ | $(1+0.000) \times 2$ |

Fig. 18

|  | I CIRCUIT PART | Q CIRCUIT PART |
|---|---|---|
| $C_{in}$ | $(1-0.03) \times 1$ | $(1+0.03) \times 1$ |
| $C_{out}$ | $(1+0.014) \times 3$ | $(1-0.03) \times 3$ |
| $C_{CP}$ | $(1-0.03) \times 3$ | $(1+0.02) \times 3$ |

COMPLEX BAND-PASS FILTER FOR USE IN DIGITAL RADIO RECEIVER AND COMPLEX BAND-PASS Δ-Σ AD MODULATOR USING THE SAME

BACKGROUND OF THE INVENTION

1. Field of the Invention

The present invention relates to a complex band-pass filter for use in a radio receiver such as digital radio receiver, a complex band-pass ΔΣ AD modulator using the same complex band-pass filter, an AD converter circuit using the complex band-pass ΔΣ AD modulator, and a digital radio receiver using the same AD converter circuit.

2. Description of the Related Art

For a high-frequency receiver circuit of a radio communication system such as a mobile telephone or a radio LAN, a low-intermediate frequency (Low-IF) receiver architecture (See, for example, First Non-Patent Document described later) is one of effective applications. When two "one-input and one-output ΔΣ AD modulators" are employed according to this application, the same AD modulators perform AD conversion on not only a signal component but also an image component, and this leads to inefficiency. On the other hand, a complex band-pass ΔΣ AD modulator performs the AD conversion on only the signal component. Therefore, the AD converter can be implemented with lower power consumption and is suitable for this application (See, for example, Second to Fourth Non-Patent Documents described later).

Further, when each of an internal AD converter and an internal DA converter of the ΔΣ AD modulator is constituted as a multi-bit converter, then the requirements for performance of the internal operational amplifier are moderated, and a larger signal-to-noise ratio (SNR) can be implemented by a low-order loop filter. Therefore, the converter with lower power consumption can be implemented. Considering these points, a data-weighted averaging algorithm (referred to as a DWA algorithm hereinafter) has been developed for the complex band-pass modulator (See, for example, Sixth to Eighth Non-Patent Documents described later). In this case, a logic circuit for implementing a DWA algorithm by a circuit is referred to as a DWA logic circuit.

Prior art documents related to the present invention are as follows:

(1) First Patent Document: Japanese Patent Laid-Open Publication No. JP-05-275972-A;

(2) Second Patent Document: Japanese Patent Laid-Open Publication No. JP-11-017549-A;

(3) Third Patent Document: Japanese Patent Laid-Open Publication No. JP-2000-244323-A;

(4) Forth Patent Document: Japanese Patent Laid-Open Publication No. JP-2002-100992-A;

(5) First Non-Patent Document: J. Crols, et al., "Low-IF Topologies for High-Performance Analog Front Ends of Fully Integrated Receivers", IEEE Transaction on Circuits and Systems II, Vol. 45, No. 3, pp. 269–282, March 1998;

(6) Second Non-Patent Document: F. Munoz et al., "A 4.7 mW 89.5 dB DR CT Complex ΔΣ ADC with Built-in LPF", ISSCC Digest of Technical Papers, Vol. 47, pp. 500–501, February 2004;

(7) Third Non-Patent Document: N. Yaghini et al., "A 43 mW CT Complex ΔΣ ADC with 23 MHz of Signal Band width and 68.6 SNDR", ISSCC Digest of Technical Papers, Vol. 47, pp. 502–503, February 2005;

(8) Fourth Non-Patent Document: S. A. Jantzi et al., "Quadrature bandpass ΣΔ modulator for digital radio", IEEE Journal of Solid-State Circuits, Vol. 32, No. 12, pp. 1935–1949, December 1997;

(9) Fifth Non-Patent Document: Akira Hayakawa et al., "Design of Discrete-Time Multi-bit Complex Bandpass ΣΔ AD modulators", Technical Report of IEICE (The Institute of Electronics, Information and Communication Engineers), IEICE Electronics Society Technical Committee on Integrated Circuits and Devices, Osaka, Jul. 13, 2004;

(10) Sixth Non-Patent Document: H. San et al., "An Element Rotation Algorithm for Multi-bit DAC Nonlinearities in Complex Bandpass Delta-sigma AD Modulators", IEEE 17th International Conference on VLSI Design, pp. 151–156, Mumbai, India, January 2004;

(11) Seventh Non-Patent Document: H. San et al., "A Noise-shaping Algorithm of Multi-bit DAC Nonlinearities in Complex Bandpass ΔΣ AD Modulators", IEICE Transactions of Fundamentals, Vol. E87-A, No. 4, pp. 792–800, April 2004;

(12) Eighth Non-Patent Document: Hiroki Wada et al., "Mapping from a DWA Algorithm into Circuit for Multi-bit Complex Band-pass ΔΣ AD Modulators", Report of Meeting of IEEJ(The Institute of Electrical Engineers of Japan) on Electronic Circuits, ECT-04-47, pp. 1–6, Hakodate, Jun. 25, 2004;

(13) Ninth Non-Patent Document: L. Longo et al., "A 15 b 30 kHz Bandpass Sigma-Delta Modulator", ISSCC Digest of Technical Papers, pp. 226–227, February 1993.;

(14) Tenth Non-Patent Document: R. Schreier, "Quadrature Mismatch-shaping", Proceedings of ISCAS, Vol. 4, pp. 675–678, May 2002;

(15) Eleventh Non-Patent Document: J. Riches et al., "Mismatch Cancellation in Quadrature Bandpass ΔΣ Modulators Using an Error Shaping Technique", IEEE Transactions on Circuits and Systems II, Vol. 49, pp. 73–85, February 2002;

(16) Twelfth Non-Patent Document: L. Breems et al., "A Quadrature Data-dependent DEM Algorithm to Improve Image Rejection of a Complex ΔΣ Modulator", IEEE Journal of Solid-State Circuits, Vol. 36, pp. 1879–1886, December 2001;

(17) Thirteenth Non-Patent Document: R. Maurino et al., "Multibit Quadrature Sigma-Delta Modulator with DEM Scheme", Proceedings of ISCAS, Vol. 1, pp. 1136–1139, May 2004; and

(18) Fourteenth Non-Patent Document: K. W. Martin et al., "Complex Signal Processing is Not Complex", IEEE Transactions on Circuits and Systems I, Vol. 51, pp. 1823–1836, September 2004.

First of all, configurations and problems of a first-order complex band-pass filter according to a first prior art and a second-order complex band-pass filter according to a second prior art employed in a complex band-pass ΔΣ AD modulator will be described.

FIG. 19 is a circuit diagram showing a configuration of the first-order complex band-pass filter according to the first prior art. Referring to FIG. 19, the first-order complex band-pass filter includes two adders SU1 and SU2, and two delay circuits DE1 and DE2 each of which delays an input signal by a time interval corresponding to one clock signal to output the delayed input signal. The first-order complex band-pass filter performs a predetermined filtering on an inputted I signal Iin and an inputted Q signal Qin, and outputs an I signal Iout and a Q signal Qout represented by the following equations:

$$I_{out}(n) = I_{in}(n-1) - Q_{out}(n-1) \quad (1), \text{ and}$$

$$Q_{out}(n) = Q_{in}(n-1) + I_{out}(n-1) \quad (2),$$

where "n" denotes a parameter indicating a processing timing. The first-order complex band-pass filter thus configured according to the first prior art has the following problems. The mismatching in the element parameters is caused between an I circuit part including the adder SU1 and the delay circuit DE1, and a Q circuit part including the adder SU2 and the delay circuit DE2. The mismatching leads to deterioration in the precisions of the output signals Iout and Qout. Further, as apparent from FIG. 19, there are signal lines crossing each other between the I and Q circuit parts. As a result, when the layout of the complex band-pass filter on an integrated circuit is designed, wirings are disadvantageously complicated, and also, a chip area disadvantageously increases.

FIG. 20 is a circuit diagram showing a configuration of a complex band-pass ΔΣ AD modulator including a one-bit second-order complex band-pass filter according to a second prior art. The complex band-pass Δ93 AD modulator includes I and Q circuit parts. The I circuit part includes the following:

(1) multipliers AP1, AP11, AP21 and AP31 each of an amplifier (a number within each symbol indicates an amplification factor, and this can be applied hereinafter);

(2) adders SU1 and SU11;

(3) delay circuits DE1 and DE11 each delaying an input signal by a time interval corresponding to one clock signal;

(4) an AD converter ADCI; and (5) DA converters DAC1 and DAC3.

The Q circuit part includes the following:

(1) multipliers AP2, AP12, AP22 and AP32 each of an amplifier;

(2) adders SU2 and SU12;

(3) delay circuits DE2 and DE12 each delaying an input signal by a time interval corresponding to one clock signal;

(4) an AD-converter ADCQ; and (5) DA converters DAC2 and DAC4.

The complex band-pass ΔΣ AD modulator thus configured according to the second prior art has the following problems. The mismatching in the element parameters is caused between the I and Q circuit parts. This mismatching leads to not only deterioration in the precisions of output signals Iout and Qout from the modulator, but also deterioration in the signal-to-noise ratio (SNR). Further, as apparent from FIG. 20, there are the signal lines crossing one another between the I and Q circuit parts. As a result, when the layout of the complex band-pass filter on an integrated circuit is designed, wirings are disadvantageously complicated and also a chip area disadvantageously increases.

FIG. 21 is a circuit diagram showing a configuration of a complex band-pass ΔΣ AD modulator including a multi-bit second-order complex band-pass filter, according to a third prior art. This is a second-order complex band-pass ΔΣ AD modulator according to a prior art previously considered by the inventors of the present invention, and is disclosed in, for example, the Fifth Non-Patent Document. Referring to FIG. 21, amplification factors are set as follows: a1=⅓, b1=-⅔, a2=3/2, and b2=2. The second-order complex band-pass ΔΣ AD modulator includes a second-order complex filter, two three-bit AD converters ADCI and ADCQ, and four three-bit DA converters DAC1, DAC2, DAC3 and DAC4.

In order to suppress the influence of nonlinearity of each of the multi-bit DA converters DAC1, DAC2, DAC3 and DAC4, the DWA algorithm developed by the inventors of the present invention is applied to the same. In addition, three multiplexers MU1-101, MU1-102 and MU1-103, and DWA logic circuits DWA1 and DWA2 are added to a feedback path formed by the four DA converters DAC1, DAC2, DAC3 and DAC4 (See, for example, the Sixth to Eighth Non-Patent Documents). A detailed configuration of each of the multiplexers MU1-101, MU1-102 and MU1-103 is similar to that of the multiplexer MU1 shown in FIG. 3. The detailed configurations of the DWA logic circuits DWA1 and DWA2 are shown in FIGS. 8 and 9, respectively, and will be described later.

The relationship among input signals and output signals inputted to and outputted from the complex band-pass ΔΣ AD modulator shown in FIG. 21 is represented by the following equation:

$$I_{out} + jQ_{out} = z^{-2}\left[\frac{1}{2}(I_{in} + jQ_{in}) + (z-j)^2(E_I + jE_Q)\right]. \quad (3)$$

In addition, the relationship among internal signals of the complex band-pass ΔΣ AD modulator shown in FIG. 21 is represented by the following equations:

$$I1(n+1) = a1 \cdot I_{in}(n+1) + b1 \cdot DAC1(n+1) - Q1(n) \quad (4),$$

$$Q1(n+1) = a1 \cdot Q_{in}(n+1) + b1 \cdot DAC2(n+1) + I1(n) \quad (5),$$

$$I2(n+1) = a2 \cdot I1(n) + b2 \cdot DAC3(n+1) - Q2(n) \quad (6), \text{ and}$$

$$Q2(n+1) = a2 \cdot Q1(n) + b2 \cdot DAC4(n+1) + I2(n) \quad (7).$$

The DAC converters DAC1 and DAC4 constitute a feedback circuit that feeds back an output signal from the AD converter ADC1. The DAC converters DAC2 and DAC3 constitute a feedback circuit that feeds back an output signal from the AD converter ADC2.

The following two problems are caused in the case of the configuration of the complex band-pass ΔΣ AD modulator shown in FIG. 21:

(1) Complicated layout: as shown in FIG. 21, in internal complex band-pass filters CBF1 and CBF2, and the feedback circuits formed by four-channel DA converters constituting I and Q circuit parts of the complex band-pass ΔΣ AD modulator, signal lines of I and Q signals cross each other in many portions. As a result, wirings are longer on the layout of an IC chip, a power consumption of a drive circuit is larger, and a chip area increases.

(2) The mismatching in the element parameters between the I and Q circuit parts: when the circuits of the complex band-pass ΔΣ AD modulator shown in FIG. 21 are implemented on the chip, the mismatching of analog circuit characteristics is caused between the I circuit part located at the upper stage of a forward path and the Q circuit part located at the lower stage of thereof due to manufacturing irregularities of element parameters. Then the quantization noise in an image band enters a signal band. This results in deterioration in the precision of the entire modulator (Concretely speaking, this leads to deterioration in the SNR (See Appendix 1 described later)). Several methods for reducing the influence of the mismatching in the element parameters between the I and Q circuit parts have been proposed (See, for example, the Tenth to Thirteenth Non-Patent Documents). These methods are not always effective for and directly applied to the configuration of the modulator proposed by the inventors of the present invention.

SUMMARY OF THE INVENTION

The present invention has been achieved to solve the above-mentioned problems. It is an object of the present invention to provide a complex band-pass filter, a complex band-pass $\Delta\Sigma$ AD modulator, an AD converter circuit, and a digital radio receiver, which are capable of preventing signal lines of I and Q signals from crossing each other in the complex band-pass filter, the complex band-pass $\Delta\Sigma$ AD modulator using the complex band-pass filter or the like, and which are further capable of preventing deterioration in the precision due to the mismatching in the element parameters between I and Q circuit parts.

According to the first aspect of the present invention, there is provided a complex band-pass filter including first and second circuit parts. The first and second circuits parts executes at least first-order complex band-pass filtering processing on an inputted complex signal including first and second signals orthogonal to each other respectively to output a filtered complex signal including third and fourth signals orthogonal to each other.

The first circuit part includes a first adder, a first delay device, a first inverter, and a first multiplexer. The first adder adds the first signal to an output signal from a first multiplexer, and outputs an addition result signal, and the first delay device delays the addition result signal from the first adder by a predetermined time interval, and outputs a delayed output signal. Then the first inverter changes a sign of the output signal from the first delay device, and outputs an output signal having a changed sign. The first multiplexer selects the output signal from the first inverter and outputs the selected output signal to the first adder for a first time interval out of the first and second time intervals different from each other and alternately occurring. On the other hand, the first multiplexer adds the output signal from the first delay device to the first adder for the second time interval.

The second circuit part includes a second adder, a second delay device, a second inverter, and a second multiplexer. The second adder adds the second signal to an output signal from a second multiplexer, and outputs an addition result signal, and the second delay device delays the addition result signal from the second adder by a predetermined further time interval, and outputs a delayed output signal. Then the second inverter changes a sign of the output signal from the second delay device, and outputs an output signal having a changed sign. The second multiplexer outputs the output signal from the second delay device to the second adder for first time interval. On the other hand, the second multiplexer selects the output signal from the second inverter and outputs the selected output signal to the second adder for the second time interval.

The complex band-pass filter includes third and fourth multiplexers. The third multiplexer outputs the first signal to the first adder and outputs the second signal to the second adder for the first time interval. On the other hand, the third multiplexer outputs the first signal to the second adder and outputs the second signal to the first adder for the second time interval. The fourth multiplexer outputs the output signal from the first delay device as the third signal and outputs the output signal from the second delay signal as the fourth signal for the first time interval. On the other hand, the fourth multiplexers outputs the output signal from the first delay device as the fourth signal and outputs the output signal from the second delay signal as the third signal for the second time interval.

According to the second aspect of the present invention, there is provided a complex band-pass $\Delta\Sigma$ AD modulator including the above-mentioned complex band-pass filter, first and second AD converters, a first DA converter, and a second DA converter. The first and second AD converters are provided at the previous stage of the fourth multiplexer, and convert the output signal from the first delay device and the output signal from the second delay device into a complex digital signal including third and fourth digital signals orthogonal to each other, respectively. The first DA converter converts the third digital signal from the first AD converter into an analog signal, and outputs the analog signal to the first adder. The second DA converter converts the fourth digital signal from the second AD converter into a further analog signal, and outputs the further analog signal to the second adder.

According to the third aspect of the present invention, the above-mentioned complex band-pass $\Delta\Sigma$ AD modulator further includes first and second logic circuits. The first logic circuit is provided between the first AD converter and the first DA converter, and substantially performs the noise-shaping on nonlinearity of the first DA converter by implementing a complex digital filter provided at the previous stage of the first DA converter and a complex digital filter provided at the subsequent stage of the first DA converter, using a high-pass element rotation method on the third digital signal from the first AD converter. The second logic circuit is provided between the second AD converter and the second DA converter, and substantially performs the noise-shaping on the nonlinearity of the second DA converter by implementing a complex digital filter provided at the previous stage of the second DA converter and a complex digital filter provided at the subsequent stage of the second DA converter, using a low-pass element rotation method on the fourth digital signal from the second AD converter. The complex band-pass $\Delta\Sigma$ AD modulator executes a complex band-pass $\Delta\Sigma$ AD modulation processing of multiple bits.

In the above-mentioned complex band-pass $\Delta\Sigma$ AD modulator, each of the first and second logic circuits includes an arithmetic circuit, and a barrel shifter. The arithmetic circuit executes a predetermined operation on the input digital signal, and the barrel shifter shifts the inputted digital signal by a shift amount calculated by the arithmetic circuit.

According to the fourth aspect of the present invention, there is provided an AD converter circuit including the above-mentioned complex band-pass $\Delta\Sigma$ AD modulator, and a decimation circuit. The decimation circuit executes predetermined decimation processing on a digital signal outputted from the complex band-pass $\Delta\Sigma$ AD modulator to perform a digital complex band-pass filtering.

According to the fifth aspect of the present invention, there is provided a digital radio receiver for receiving an analog radio signal and outputting a received digital signal, said digital radio receiver, and the above-mentioned AD converter circuit.

Therefore, the complex band-pass filer, the complex band-pass $\Delta\Sigma$ AD modulator, the AD converter circuit, and the digital radio receiver, according to the present invention can prevent two signal lines orthogonal to each other from crossing each other, and can prevent deterioration in the precision due to the mismatching in the element parameters between the two circuit parts.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 17 is a table showing mismatching in the capacitance parameters between the I and Q circuit parts, according to the first implemental example;

FIG. 18 is a table showing mismatching in the capacitance parameters between the I and Q circuit parts, according to the second implemental example;

DETAILED DESCRIPTION OF THE PREFERRED EMBODIMENTS

Preferred embodiments according to the present invention will be described below with reference to the attached drawings.

First Preferred Embodiment

Figure 1:
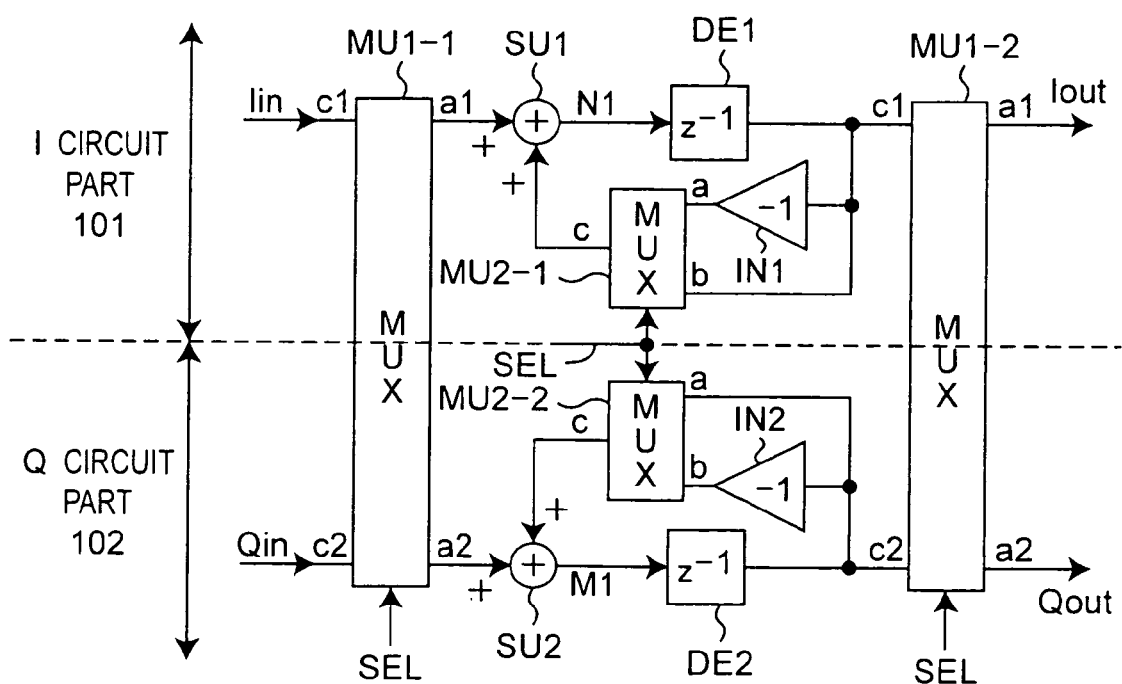
FIG. 1 is a circuit diagram showing a configuration of a first-order complex band-pass filter, according to a first preferred embodiment of the present invention.
Figure 19:
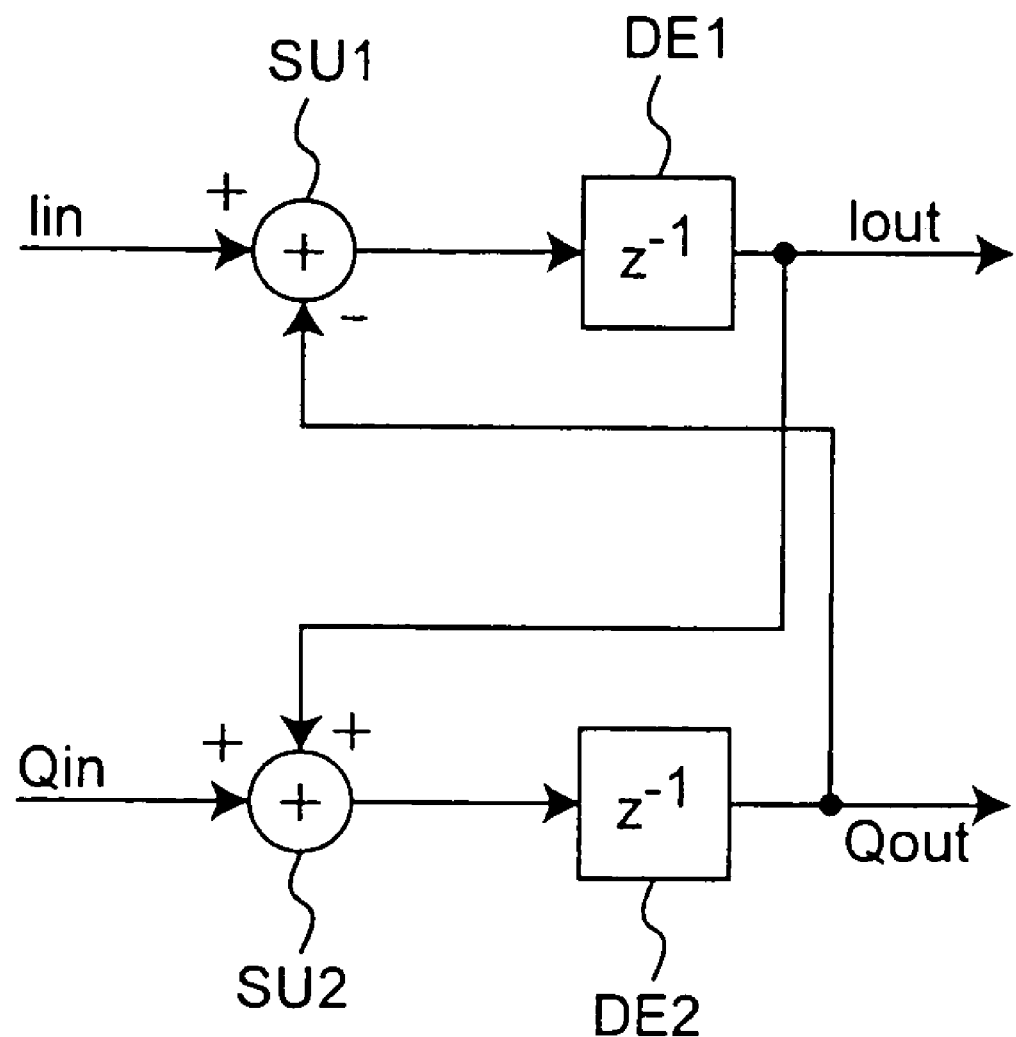
FIG. 19 is a circuit diagram showing a configuration of a first-order complex band-pass filter, according to a first prior art.

FIG. 1 is a circuit diagram showing a configuration of a first-order complex band-pass filter according to a first preferred embodiment of the present invention. The first-order complex band-pass filter according to a first preferred embodiment is characterized, as compared with the first-order complex band-pass filter according to the first prior art shown in FIG. 19, by further including four multiplexers MU1-1, MU1-2, MU2-1 and MU2-2, and two inverters IN1 and IN2 so as to solve the above-described two problems.

Figure 2:
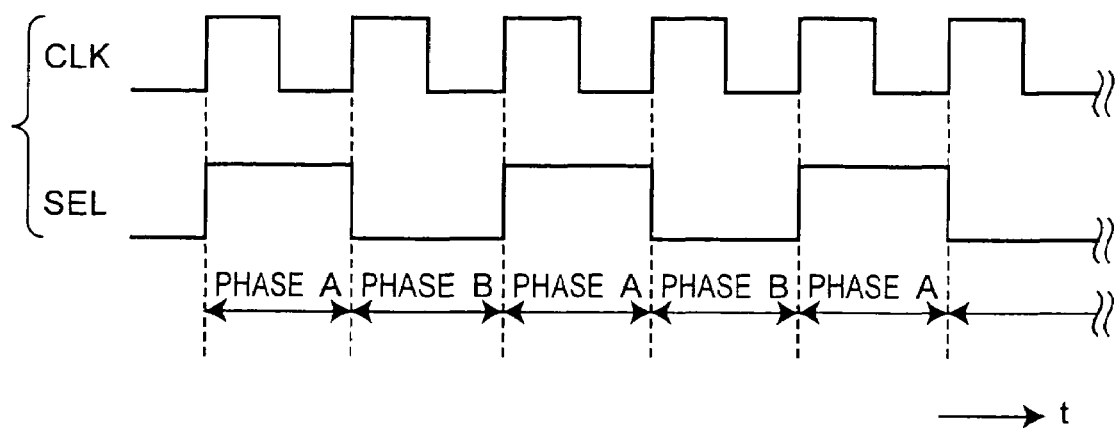
FIG. 2 is a timing chart showing a temporal relationship between a clock signal CLK and a selection signal SEL for use in the first-order complex band-pass filter shown in FIG. 1.

FIG. 2 is a timing chart of a temporal relationship between a clock signal CLK and a selection signal SEL for use in the first-order complex band-pass filter shown in FIG. 1. Referring to FIG. 2, at a leading edge of the clock signal CLK for use in the present preferred embodiment, a high level and a low level of the selection signal SEL are selectively switched to generate the selection signal SEL. A time interval for which the selection signal SEL has the high level is defined as a phase A, and a time interval when the selection signal SEL has the low level is defined as a phase B. These two time intervals are different from each other and generated alternately. It is noted that the clock signal CLK and the selection signal SEL are generated by predetermined generators (not shown).

Figure 3:
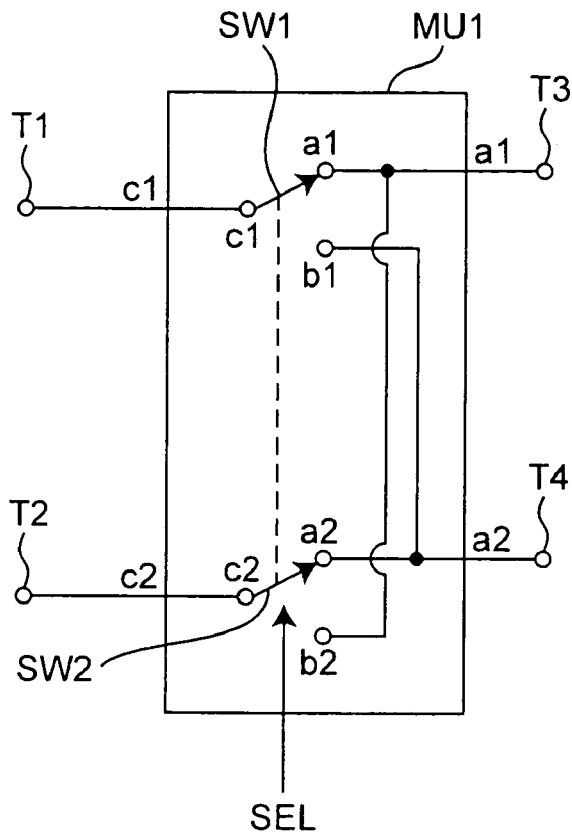
FIG. 3 is a circuit diagram showing a detailed configuration of a multiplexer MU1 employed in the first-order complex band-pass filter shown in FIG. 1.

FIG. 3 is a circuit diagram of a detailed configuration of each of the multiplexers MU1-1 and MU1-2 for use in the first-order complex band-pass filter shown in FIG. 1. The multiplexers MU1-1 and MU1-2 as well as a multiplexer MU1-X (where X is an arbitrary number) as described later have the same configuration as each other, and will be generically denoted by "MU1" hereinafter. Referring to FIG. 3, the multiplexer MU1 includes two switches SW1 and SW2. The switches SW1 and SW2 are switched interlockingly with each other based on the selection signal SEL, and are switched over between a contact "a1" side and a contact "a2" side, respectively, for the time interval of the phase A. In addition, each of the switches SW1 and SW2 is switched over between a contact "b1" side and a contact "b2" side, respectively, for the time interval of the phase B. In the multiplexer MU1 thus configured, for the time interval of the phase A, a signal inputted to a terminal T1 is outputted to a terminal T3 via a common terminal "c1" and the contact "a1" of the switch SW1. In addition, a signal inputted to a terminal T2 is outputted to a terminal T4 via a common terminal "c2" and the contact "a2" of the switch SW2. For the time interval of the phase B, the signal inputted to the terminal T1 is outputted to the terminal T4 via the common terminal "c1" and the contact "b1" of the switch SW1. In addition, the signal inputted to the terminal T2 is outputted to the terminal T3 via the common terminal "c2" and the contact "b2" of the switch SW2. The multiplexer MU1 is a reversible circuit and can operate even if the direction of each signal is opposite to that described above.

Figure 4:
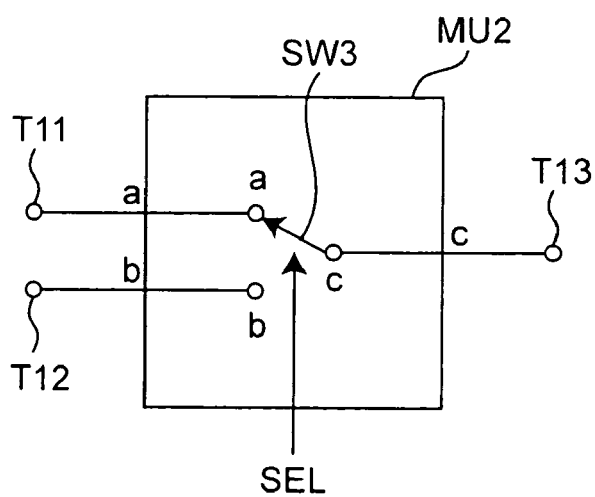
FIG. 4 is a circuit diagram showing a detailed configuration of a multiplexer MU2 employed in the first-order complex band-pass filter shown in FIG. 1.

FIG. 4 is a circuit diagram of a detailed configuration of the multiplexer MU2 for use in the first-order complex band-pass filter shown in FIG. 1. The multiplexers MU2-1 and MU2-2 as well as a multiplexer MU2-X (where X is an arbitrary number) described later have the same configuration as each other, and will be generically denoted by "MU2" hereinafter. Referring to FIG. 4, the multiplexer MU2 includes a switch SW3. The switch SW3 is switched based on the selection signal SEL and switched over to a contact "a" for the time interval of the phase A, and is switched over to a contact "b" for the time interval of the phase B. In the multiplexer MU2 thus configured, for the time interval of the phase A, a signal inputted to a terminal T11 is outputted to a terminal T13 via the contact "a" and a common terminal "c" of the switch SW3. For the time interval of the phase B, a signal inputted to a terminal T12 is outputted to the terminal T13 via the contact "b" and the common terminal "c" of the switch SW3. The multiplexer MU2 is reversible circuit and can operate even if the direction of each signal is opposite to that as described above.

Referring to FIG. 1, the first-order complex band-pass filter according to the present preferred embodiment includes an I circuit part 101 and a Q circuit part 102. The I circuit part 101 relates to circuits provided in an upper portion of the first-order complex band-pass filter shown in FIG. 1. The Q circuit part 102 relates to circuits provided in a lower portion of the first-order complex band-pass filter shown in FIG. 1. An I signal Iin of an input analog signal is inputted to the contact "c1" of the multiplexer MU1-1, and a Q signal Qin of an input analog signal is inputted to the contact "c2" of the multiplexer MU1-1. The signal from the contact "a1" of the multiplexer MU1-1 is outputted to the adder SU1, and the signal from the contact "a2" of the multiplexer MU1-1 is outputted to the adder SU2. The adder SU1 adds up the signal from the multiplexer MU1-1 and the signal from the multiplexer MU2-1, and then, outputs an addition result signal to the contact "c1" of the multiplexer MU1-2 and the contact "b" of the multiplexer MU2-1 via the delay circuit DE1. In addition, the adder SU1 outputs the addition result signal to the contact "a" of the multiplexer MU2-1 via the inverter IN1. Further, the signal from the multiplexer MU2-1 is outputted to the adder SU1.

The adder SU2 adds up the signal from the multiplexer MU1-1 and the signal from the multiplexer MU2-2, and then, outputs an addition result signal to the contact "c2" of the multiplexer MU1-2 and the contact "a" of the multiplexer MU2-2 via the delay circuit DE2. In addition, the adder SU2 outputs the addition result signal to the contact "b" of the multiplexer MU2-2 via the inverter IN2. Further, the signal from the multiplexer MU2-2 is outputted to the adder SU2. Each of the delay circuits DE1 and DE2 delays the input signal by a time interval corresponding to one cycle of the clock signal CLK, and outputs the delayed signal. The multiplexer MU1-2 outputs a filtered I signal Iout from its contact "a1", and outputs a filtered Q signal Qout from its contact "a2".

In the first-order complex band-pass filter thus configured, the four multiplexers MU1-1, MU1-2, MU2-1 and MU2-2 are alternately switched over between the time interval of the phase A and the time interval of the phase B based on the selection signal SEL. Accordingly, in the circuit parts sandwiched between the multiplexers MU1-1 and MU1-2, a processing performed by the I circuit part 101 and a processing performed by the Q circuit part 102 are alternately switched over between them, and signs of the signals inputted to the adders SU1 and SU2 are inverted, respectively. Then it is possible to perform the same processing as that performed by the first-order complex band-pass filter according to the first prior art shown in FIG. 19.

As apparent from FIG. 1, the first-order complex band-pass filter according to the present preferred embodiment can prevent the signal lines of the two signals orthogonal to each other from crossing each other. In addition, the first-order complex band-pass filter according to the present preferred embodiment can prevent deterioration in the precision due to the mismatching in the element parameters between the two processing circuit parts that perform the two signals, respectively, as described later in detail.

In the first preferred embodiment, the complex band-pass filter that processes the analog signals has been described. However, the present invention is not limited to this. The first-order complex band-pass filter may be a complex band-pass filter that processes digital signals. The same thing is true for subsequent preferred embodiments when the complex band-pass filter operates solely.

Second Preferred Embodiment

Figure 5:
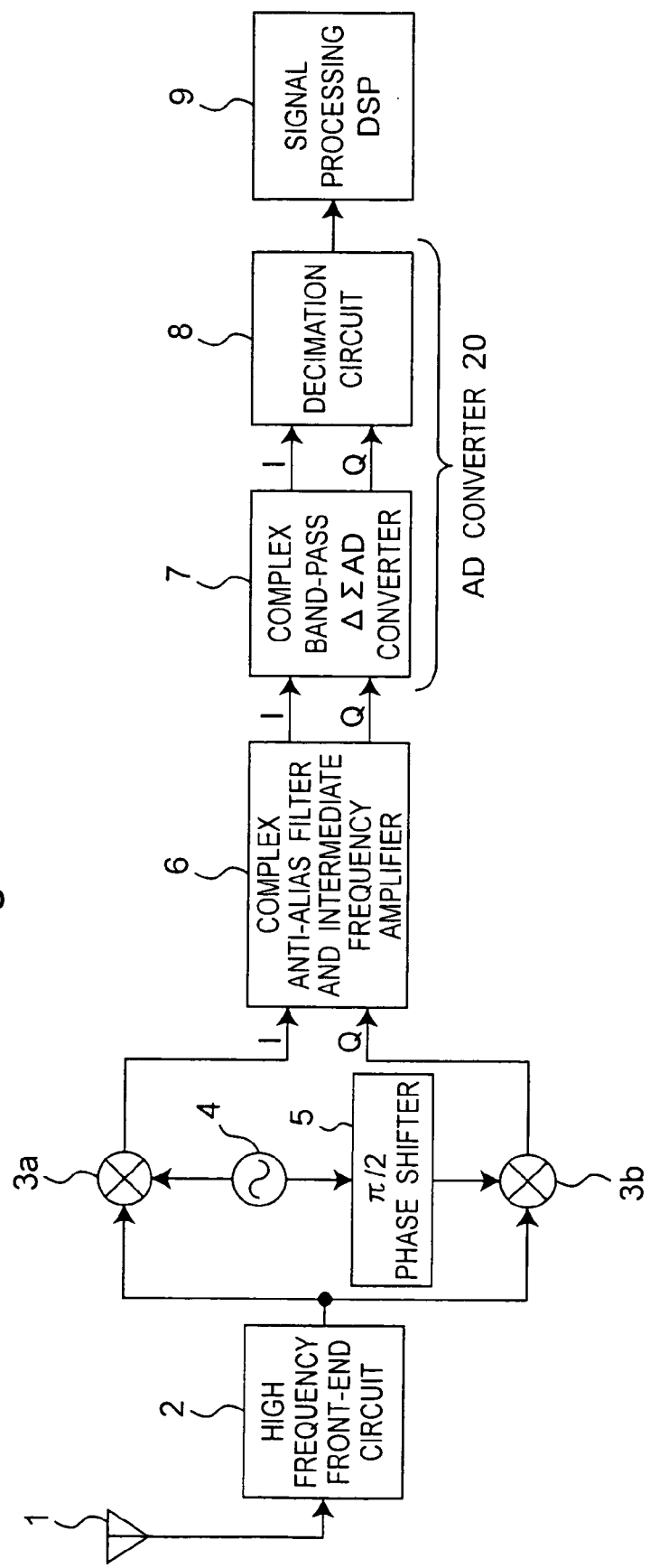
FIG. 5 is a block diagram showing a configuration of a digital radio receiver including an AD converter 20 that includes a complex band-pass ΔΣ AD modulator 7 and a decimation circuit 8, according to a second preferred embodiment of the present invention.

FIG. 5 is a block diagram showing a configuration of a digital radio receiver including an AD converter circuit 20 that includes a complex band-pass ΔΣ AD modulator 7 and a decimation circuit 8, according to a second preferred embodiment of the present invention.

Referring to FIG. 5, a radio signal received by an antenna 1 is subjected to a processing such as low-noise high-frequency amplification by a high-frequency front-end circuit 2, and is divided into two signals. The resultant two radio signals are inputted to mixers 3a and 3b, respectively. On the other hand, a local oscillator 4 generates a local oscillation signal having a predetermined local oscillation frequency, and outputs the generated local oscillation signal to the mixer 3a and to the mixer 3b via a π/2 phase shifter 5. The mixer 3a mixes the inputted two input signals, and makes an I signal after mixture to pass through a complex anti-alias filter and intermediate frequency amplifier 6 serving as a band-pass filter, so as to extract an intermediate frequency I signal. In addition, the mixer 3a outputs the extracted intermediate frequency I signal to the complex band-pass ΔΣ AD modulator 7. The mixer 3b mixes up the two input signals, and makes a Q signal after mixture (orthogonal to the I signal after the mixture) to pass through the complex anti-alias filter and intermediate frequency amplifier 6 serving as the band-pass filter, so as to extract an intermediate frequency analog Q signal. In addition, the mixer 3b outputs the extracted intermediate frequency Q signal to the complex band-pass ΔΣ AD modulator 7.

Furthermore, the complex band-pass ΔΣ AD modulator 7 converts an analog intermediate frequency signal including an analog intermediate frequency I signal and an analog intermediate frequency Q signal into a digital intermediate frequency signal including a digital intermediate frequency I signal and a digital intermediate frequency Q signal. In addition, the complex band-pass ΔΣ AD modulator 7 outputs the digital intermediate frequency signal to the decimation circuit 8. The decimation circuit 8 executes a predetermined decimation processing on the inputted digital intermediate frequency signal, so as to subject the signal to complex band-pass filtering. In addition, the decimation circuit 8 outputs the processed digital signal to a signal processing digital signal processor (DSP) 9. The decimation circuit 8, which is constituted by a digital filter circuit, converts a low-bit high-rate digital signal of, for example, three bits having a bit rate of 20 Mbps into a high-bit low-rate digital signal of, for example, 12 bits having a bit rate of 1 kbps, and outputs the high-bit low-rate digital signal to the signal processing DSP 8. The complex band-pass ΔΣ AD modulator 7 and the decimation circuit 8 constitute the AD converter circuit 20. Further, the signal processing DSP 9 performs processings such as clock reproduction and demodulation on the inputted digital signal to obtain a demodulated data signal.

Figure 6:
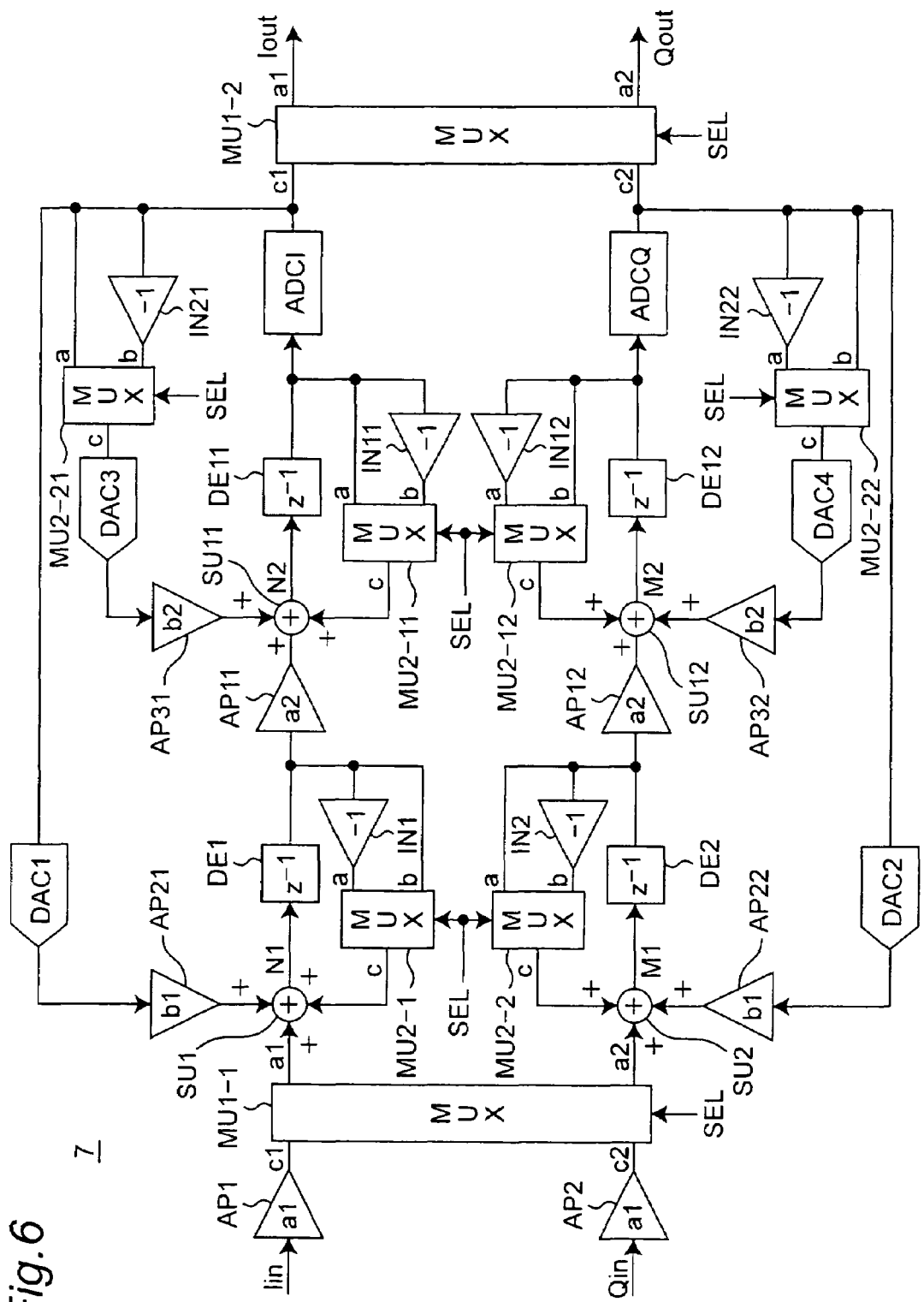
FIG. 6 is a circuit diagram showing a configuration of the one-bit complex band-pass ΔΣ AD modulator 7 shown in FIG. 5.

FIG. 6 is a circuit diagram showing a configuration of the one-bit complex band-pass ΔΣ AD modulator 7 shown in FIG. 5. Referring to FIG. 6, the one-bit complex band-pass ΔΣ AD modulator 7 will be described.

Referring to FIG. 6, an I signal Iin of an analog signal is inputted to a contact "c1" of a multiplexer MU1-1 via a multiplier AP1 having a multiplication coefficient of "a1". A Q signal Qin of an analog signal is inputted to a contact "c2" of the multiplexer MU1-1 via a multiplier AP2 having a multiplication coefficient of "a1". The signal outputted from a contact "a1" of the multiplexer MU1-1 is inputted to an adder SU1. It is noted that a first-order complex band-pass filter, that includes the adder SU1, a delay circuit DE1, an inverter IN1, and a multiplexer MU2-1 has the same configuration as that shown in FIG. 1. The signal outputted from the delay circuit DE1 is outputted to an adder SU11 via a multiplier AP11 having a multiplication coefficient of "a2". A first-order complex band-pass filter, that includes an adder SU2, a delay circuit DE2, an inverter IN2, and a multiplexer MU2-2, has the same configuration as that shown in FIG. 1. The signal outputted from the delay circuit DE2 is outputted to an adder SU12 via a multiplier AP12 having a multiplication coefficient of "a2".

The second-stage first-order complex band-pass filter, that includes the adder SU11, a delay circuit DE11, an inverter IN11, and a multiplexer MU2-11, has the same configuration as that of the first-stage first-order complex band-pass filter provided at the previous stage of the former filter except for that the inverter IN11 is connected to a contact "b" of the multiplexer MU2-11. The output signal from the delay circuit DE1 is converted into a digital signal by an AD converter ADCI. The digital signal is outputted to a contact "c1" of a multiplexer MU1-2, a DA converter DAC1, and a contact "a" of a multiplexer MU2-21, and is outputted to a contact "b" of the multiplexer MU2-21 via an inverter IN21. A feedback circuit of the circuits of the second-stage first-order complex band-pass filter is constituted by including the inverter IN21, the multiplexer MU2-21, a DA converter DAC3, and a multiplier AP31 having a multiplication coefficient of "b2". The output signal from a contact "c" of the multiplexer MU2-21 is converted into an analog signal by the DA converter DAC3. The analog signal is outputted to the adder SU11 via the multiplier AP31. Further, in a feedback circuit of the circuits of the first-stage first-order complex band-pass filter, the output signal from the DA converter DAC1 is outputted to the adder SU1 via an amplifier AP21 having an amplification coefficient of "b1".

The second-stage first-order complex band-pass filter, that includes an adder SU11, a delay circuit DE12, an inverter IN12, and a multiplexer MU2-12, has the same configuration as that of the first-stage first-order complex band-pass filter provided at the previous stage of the former filter except for that the inverter IN12 is connected to a contact "a" of the multiplexer MU2-12. The output signal from the delay circuit DE12 is converted into a digital signal by an AD converter ADCQ. The digital signal is outputted to a contact "c2" of the multiplexer MU1-2, a DA converter DAC2, and a contact "b" of a multiplexer MU2-22, and is outputted to a contact "a" of the multiplexer MU2-22 via an inverter IN22. A feedback circuit of the circuits of the second-stage first-order complex band-pass filter is constituted by including the inverter IN22, the multiplexer MU2-22, a DA converter DAC4, and a multiplier AP32 having a multiplication coefficient of "b2". The output signal from a contact "c" of the multiplexer MU2-22 is converted into an analog signal by the DA converter DAC4. The analog signal is outputted to the adder SU12 via the multiplier AP32. Further, in a feedback circuit of the circuits of the first-stage first-order complex band-pass filter, the output signal from the DA converter DAC2 is outputted to the adder SU2 via an amplifier AP22 having an amplification coefficient of "b1".

The multiplexers MU1-1 and MU1-2 operate in a manner similar to that of FIG. 1, respectively. In addition, the multiplexers MU2-1, MU2-2, MU2-11, MU2-21 and MU2-22 operate in a manner similar to that of the multiplexers MU2-1 and MU2-2 shown in FIG. 1.

The complex band-pass ΔΣ AD modulator thus configured as shown in FIG. 6 is ideally a complex band-pass ΔΣ AD modulator equivalent to that shown in FIG. 20, as described below.

At a timing of n=2k−1, the I signal Iin of the analog signal is inputted into the upper half of the I circuit part and the Q signal Qin of the analog signal is inputted into the lower half of the Q circuit part. Further, the digital output signal Iout is outputted from the AD converter ADCI of the upper half of the I circuit part, and the digital output signal Qout is outputted from the AD converter ADCQ of the lower half of the Q circuit part. The relational equations of the internal signals of the modulator are as follows:

$$N1(2k)=a1 \cdot I_{in}(2k)+b1 \cdot DAC1(2k)-N1(2k-1) \quad (8),$$

$$M1(2k)=a1 \cdot Q_{in}(2k)+b1 \cdot DAC2(2k)+M1(2k-1) \quad (9),$$

$$N2(2k)=a2 \cdot N1(2k-1)+b2 \cdot DAC3(2k)+N2(2k-1) \quad (10), \text{ and}$$

$$M2(2k)=a2 \cdot M1(2k-1)+b2 \cdot DAC4(2k)-M2(2k-1) \quad (11).$$

In this case, the relationship as represented by the following equations is given:

$$N1(2k-1)=Q1(2k-1) \quad (12),$$

$$M1(2k-1)=I1(2k-1) \quad (13),$$

$$N2(2k-1)=I2(2k-1) \quad (14), \text{ and}$$

$$M2(2k-1)=Q2(2k-1) \quad (15).$$

The DA converters DAC1 and DAC3 form a feedback circuit that processes the output signal from the AD converter ADCI (I signal). The DA converters DAC2 and DAC4 form a feedback circuit that processes the output signal from the AD converter ADCQ (Q signal). Accordingly, the equation (8) coincides with the equation (4), the equation (9) coincides with the equation (5), the equation (11) coincides with the equation (6), and the equation (10) coincides with the equation (7).

At a timing n=2 k, the I signal Iin of the analog signal is inputted to the lower half Q circuit part, and the Q signal Qin of the analog signal is inputted to the upper half of the I circuit part. In this case, the digital output signal Iout is outputted from the AD converter ADCQ of the lower half of the Q circuit part, and the digital output signal Qout is outputted from the AD converter ADCI of the upper half of the I circuit part. The relational equations of the internal signals of the modulator are as follows:

$$N1(2k+1) = a1 \cdot Q_{in}(2k+1) + b1 \cdot DAC1(2k+1) + N1(2k) \quad (16),$$

$$M1(2k+1) = a1 \cdot I_{in}(2k+1) + b1 \cdot DAC2(2k+1) - M1(2k) \quad (17),$$

$$N2(2k+1) = a2 \cdot N1(2k) + b2 \cdot DAC3(2k+1) - N2(2k) \quad (18), \text{ and}$$

$$M2(2k+1) = a2 \cdot M1(2k) + b219\ DAC4(2k+1) + M2(2k) \quad (19)$$

In this case, the relationship as represented by the following equations is given:

$$N1(2k) = I1(2k) \quad (20),$$

$$M1(2k) = Q1(2k) \quad (21),$$

$$N2(2k) = Q2(2k) \quad (22), \text{ and}$$

$$M2(2k) = I2(2k) \quad (23).$$

The DA converters DAC1 and DAC3 form the feedback circuit that processes the output signal from the AD converter ADCI (I signal). The DA converters DAC2 and DAC4 form the feedback circuit that processes the output signal from the AD converter ADCQ (Q signal). Accordingly, the equation (17) coincides with the equation (4), the equation (16) coincides with the equation (5), the equation (18) coincides with the equation (6), and the equation (19) coincides with the equation (7). It is thus proved that the configuration of the complex band-pass ΔΣ AD modulator 7 shown in FIG. 6 is equivalent to the configuration of the circuits shown in FIG. 20.

Figure 20:
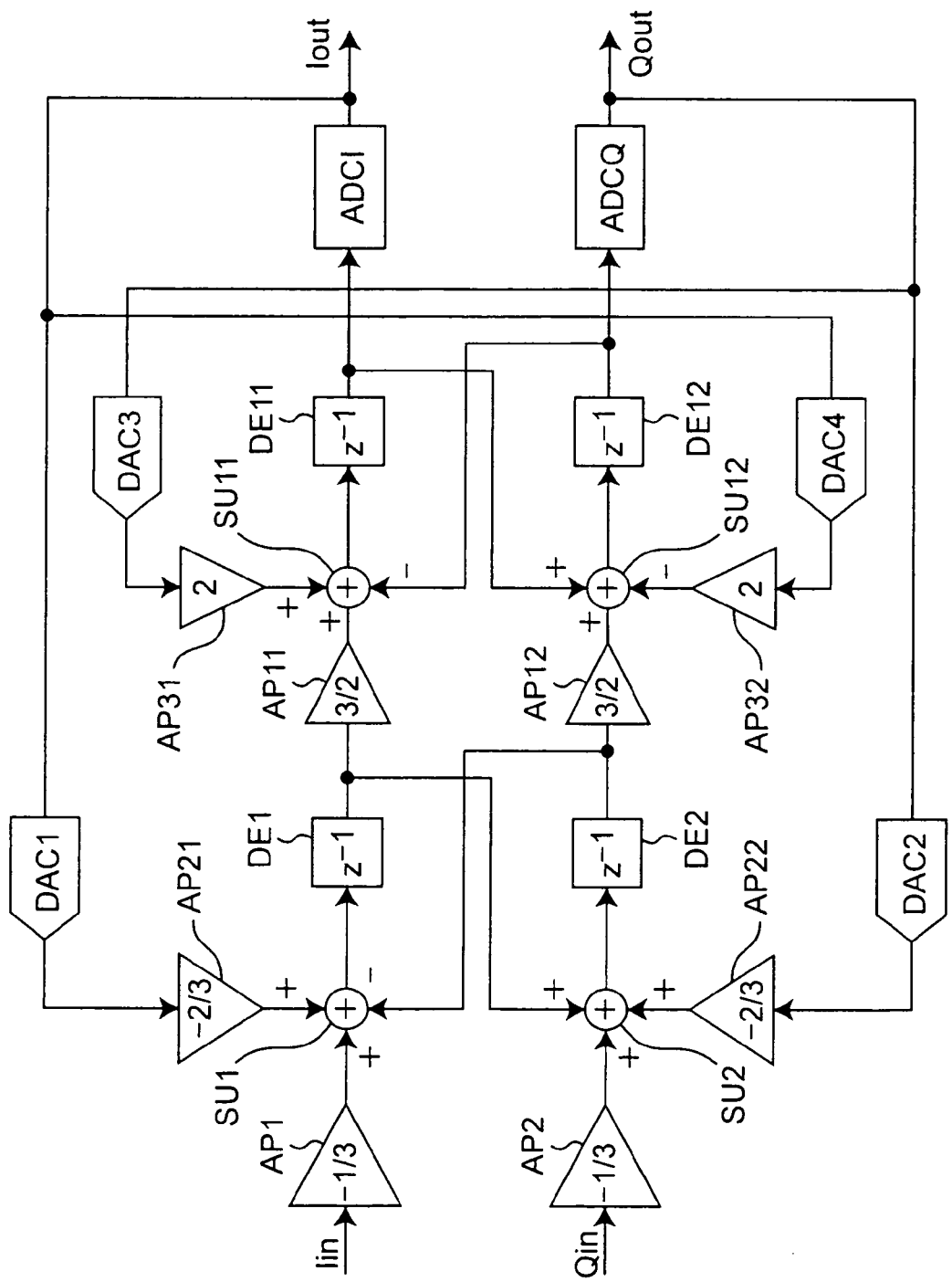
FIG. 20 is a circuit diagram showing a configuration of a complex band-pass ΔΣ AD modulator, according to a second prior art.
Figure 21:
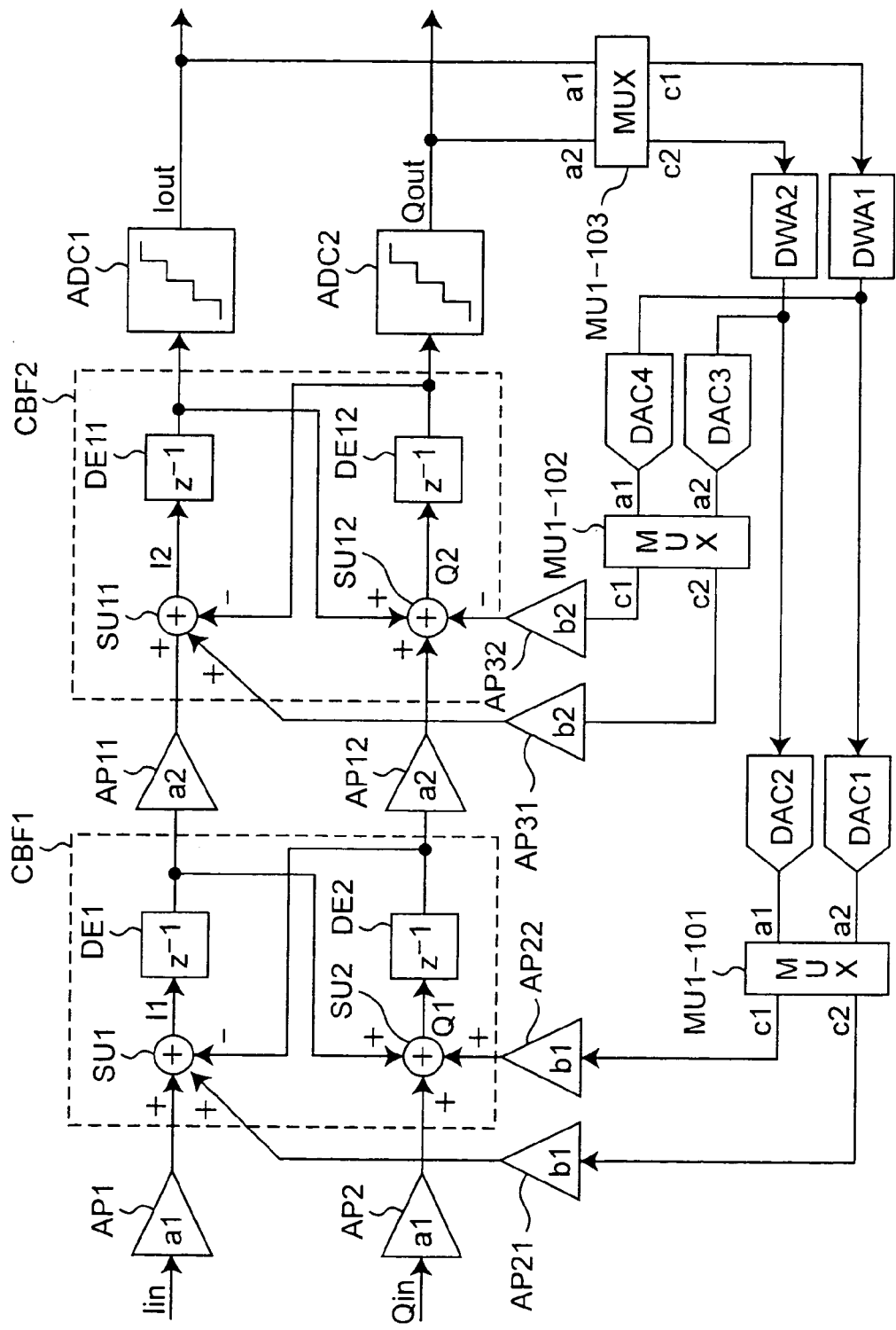
FIG. 21 is a circuit diagram showing a configuration of a band-pass ΔΣ AD modulator including a multi-bit second-order complex band-pass filter, according to a third prior art.

As shown in FIG. 6, crossing portions in which the signal lines cross each other in the respective complex digital filters shown in FIG. 20 and those in which the signal lines cross each other in the feedback circuit for the DA converters DAC3 and DAC4 are eliminated. Therefore, the complex band-pass ΔΣ AD modulator 7 is configured so that the I signal paths are completely separated from the Q signal paths. Accordingly, the wiring lengths become smaller and the chip area becomes smaller at the time of laying out the modulator. In order to implement the circuit configuration, the following respects should be taken care of.

(1) Each of the multiplexers MU1-1, MU1-2, MU2-1, MU2-2, MU2-11, MU2-12, MU2-21 and MU2-22 can be easily implemented by a switch using a MOSFET.

(2) In the complex digital filters and the DA converters DAC1, DAC2, DAC3 and DAC4 of the feedback circuits, the operation for multiplication of the signal by 1 and that for multiplication of the signal by −1 are alternately performed per cycle of the clock signal CLK using the multiplexers MU2-21 and MU2-22 so as to keep the polarity of the signal during complex signal processing. In order to implement these circuits, the same circuits chop two differential signal output terminals every clock.

Third Preferred Embodiment

Figure 7:
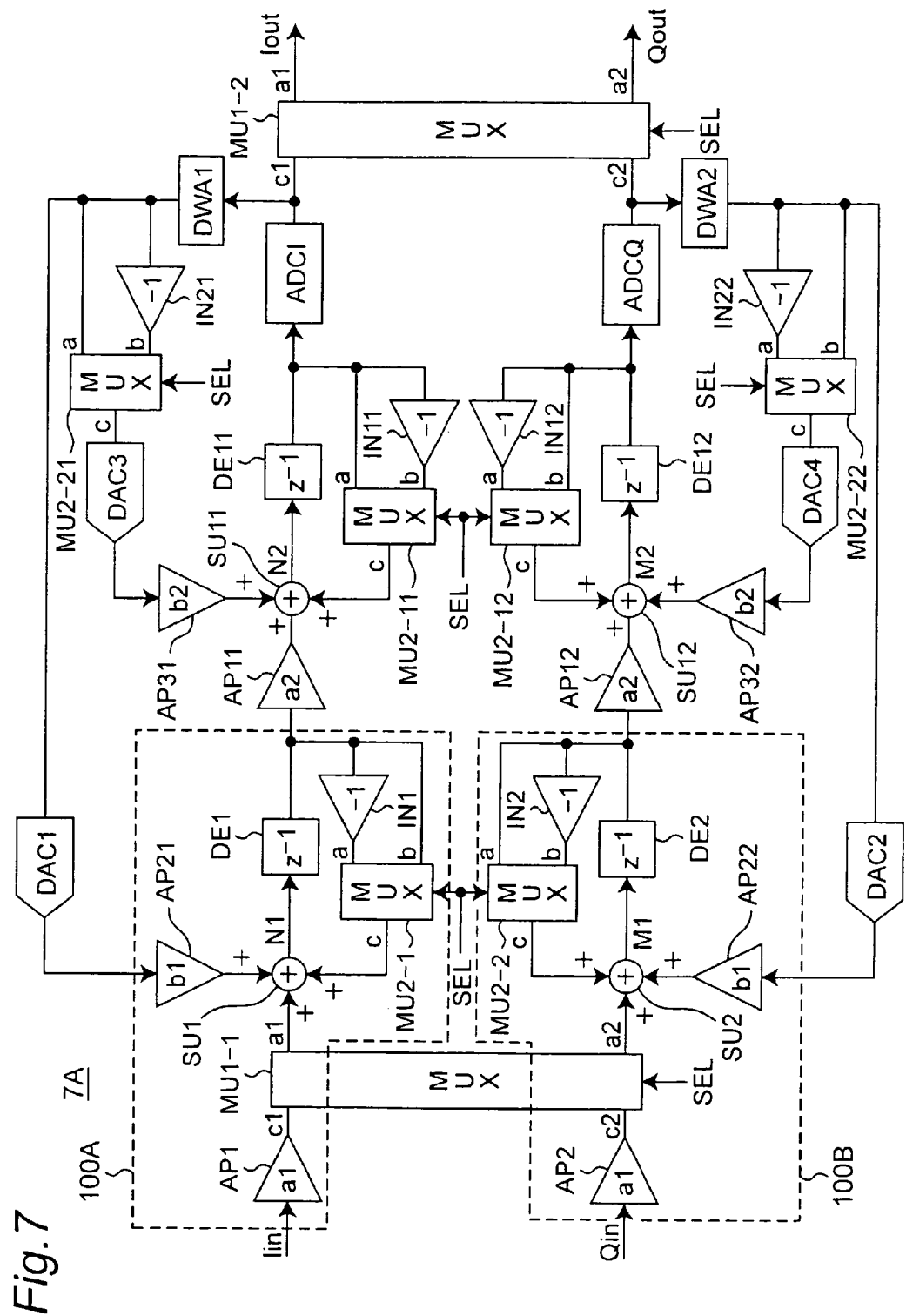
FIG. 7 is a circuit diagram showing a configuration of a multi-bit complex band-pass ΔΣ AD modulator 7A, according to a third preferred embodiment of the present invention.

FIG. 7 is a circuit diagram showing a configuration of a multi-bit complex band-pass ΔΣ AD modulator 7A according to a third preferred embodiment of the present invention. The multi-bit complex band-pass ΔΣ AD modulator 7A according to the third preferred embodiment is characterized as follows. As compared with the second preferred embodiment shown in FIG. 6, the multi-bit complex band-pass ΔΣ AD modulator characterized by constituting the same as follows. A DWA logic circuit DWA1 is provided at an immediately subsequent stage an AD converter ADCI and at the previous stage of a DA converter DAC1. A DWA logic circuit DWA2 is provided at an immediately subsequent stage an AD converter ADCQ and at the previous stage of a DA converter DAC2.

Figure 8:
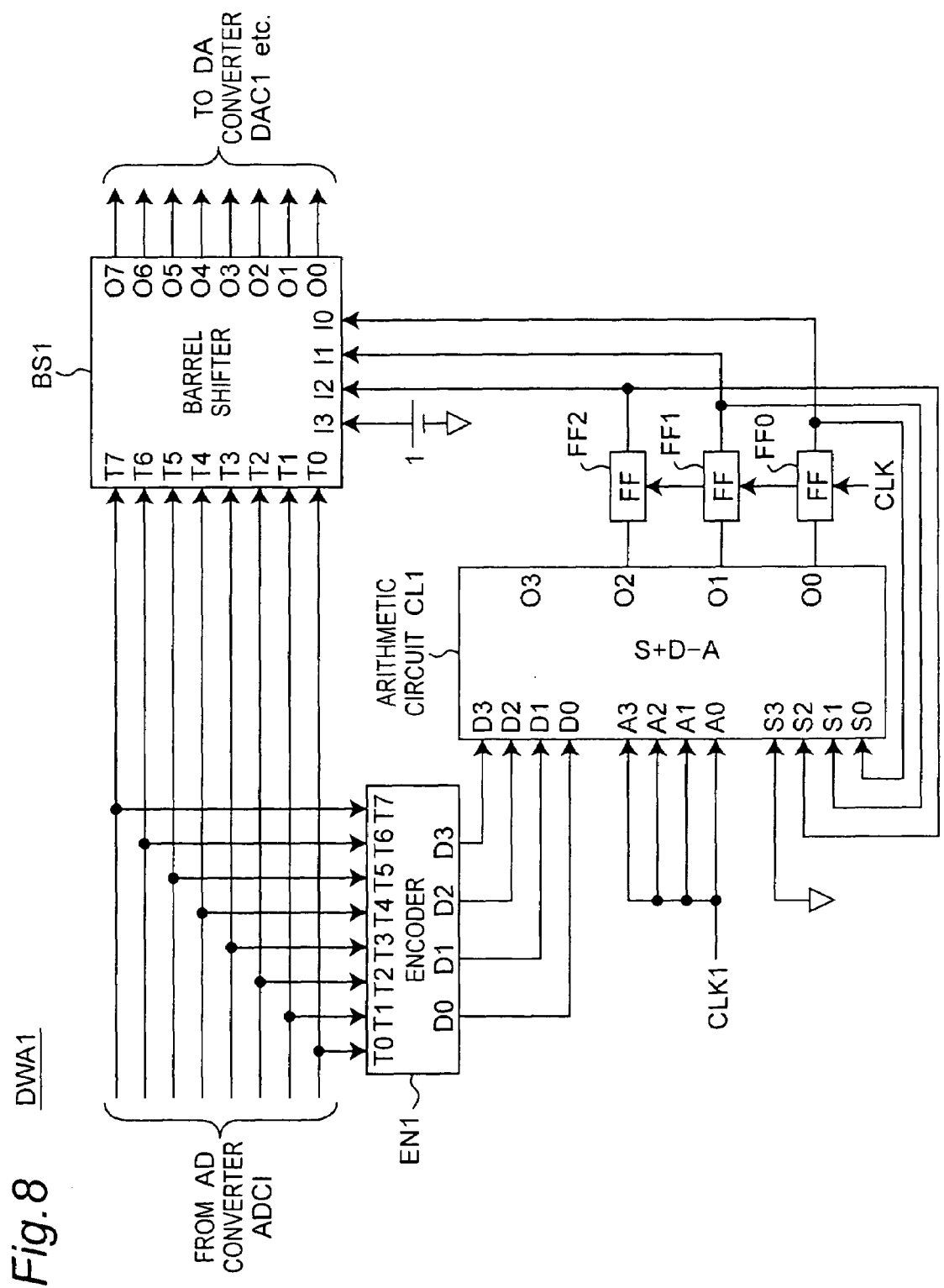
FIG. 8 is a circuit diagram showing a configuration of a DWA logic circuit DWA1 shown in FIG. 7.
Figure 9:
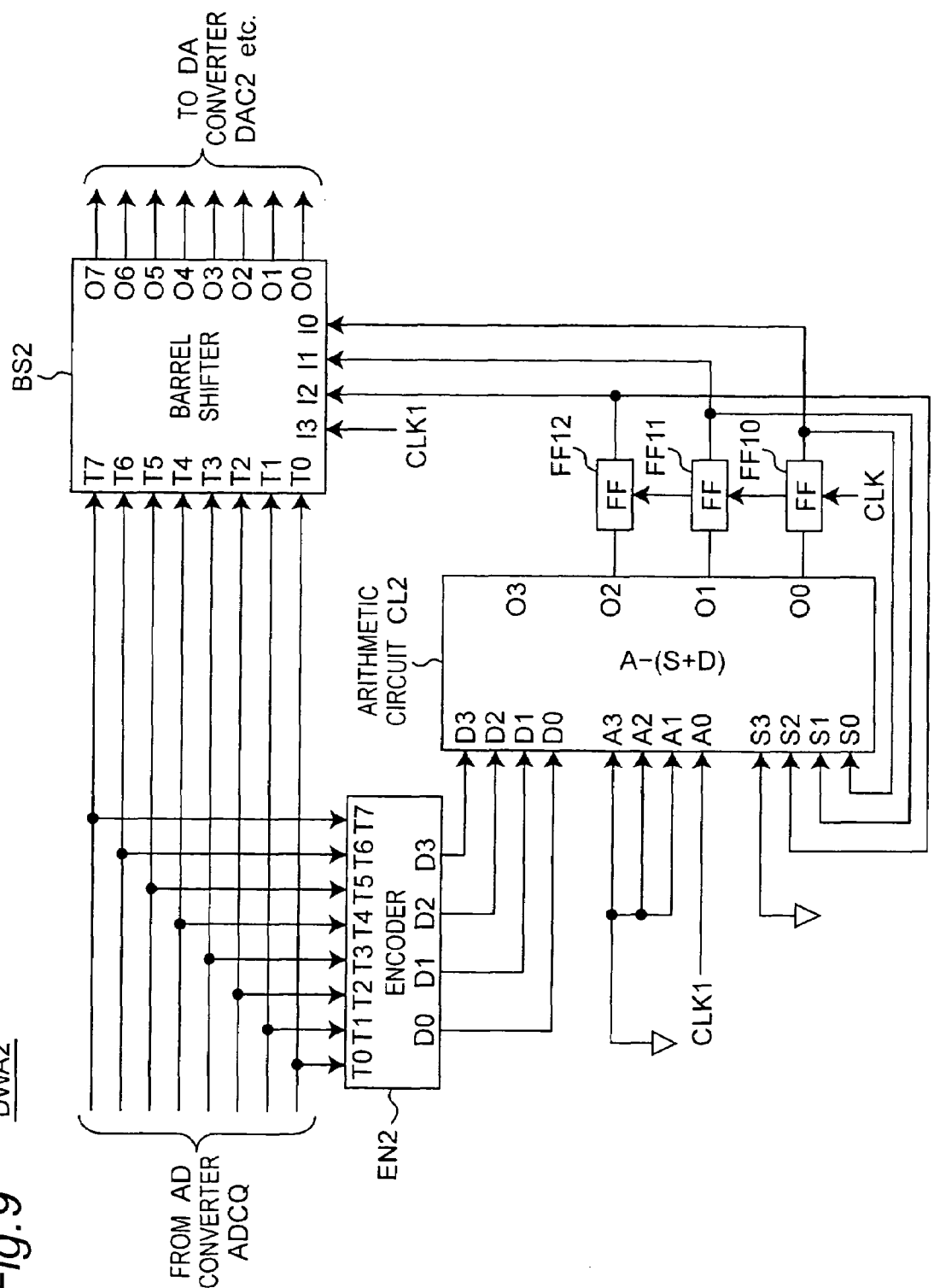
FIG. 9 is a circuit diagram showing a configuration of a DWA logic circuit DWA2 shown in FIG. 7.
Figure 10:
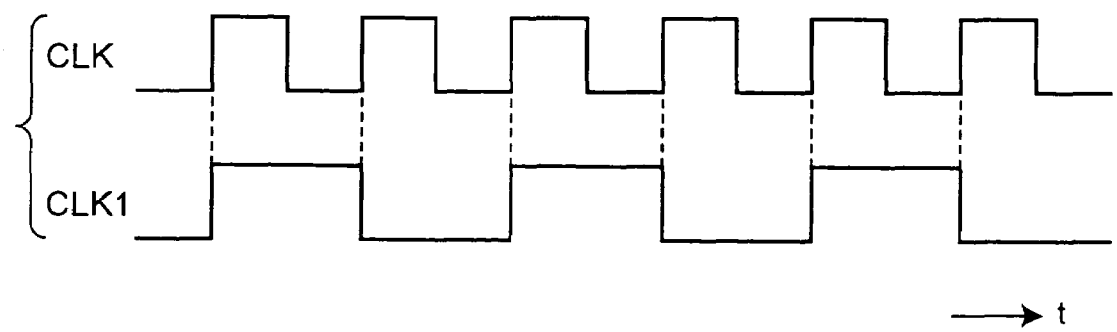
FIG. 10 is a timing chart showing a temporal relationship between two clock signals CLK and CLK1 for use in the two DWA logic circuits DWA1 and DWA2 shown in FIG. 7.

FIG. 8 is a block diagram showing a configuration of the DWA logic circuit DWA1 shown in FIG. 7, and FIG. 9 is a block diagram showing a configuration of the DWA logic circuit DWA2 shown in FIG. 7. FIG. 10 is a timing chart of clock signals CLK and CLK1 of sampling clocks supplied to the DWA logic circuit DWA1 shown in FIG. 8 and to the DWA logic circuit DWA2 shown in FIG. 9, respectively. As shown in FIG. 10, one cycle of the clock signal CLK1 is half one cycle of the clock signal CLK, and the clock signals CLK1 and CLK are synchronized with each other.

Referring to FIG. 8, the DWA logic circuit DWA1 includes an encoder EN1, an arithmetic circuit CL1, a barrel shifter BS1, and three flip-flops FF0 to FF2 that are register circuits. Eight-bit digital output signals of thermometer code inputted from the AD converter ADCI are inputted to the encoder EN1 and the barrel shifter BS1. The encoder EN1 converts eight-bit input signals T0 to T7 of the thermometer code into four-bit binary signals, and outputs the four-bit binary signals to D input terminals D0 to D3 of the arithmetic circuit CL1, respectively. The encoder EN1 converts the input signals into output signals as follows. When the input signals T7, T6, T5, T4, T3, T2, T1 and T0 are set to 0, 0, 0, 0, 0, 1, 1 and 1, respectively, (namely, (T7, T6, T5, T4, T3, T2, T1, T0)=(0, 0, 0, 0, 0, 1, 1, 1)), the output signals D3, D2, D1 and D0 become 0, 0, 1 and 1, respectively, (namely, (D3, D2, D1, D0)=(0, 0, 1, 1)). In addition, when the input signals T7, T6, T5, T4, T3, T2, T1 and T0 are set to 0, 0, 1, 1, 1, 1, and 1, respectively, (namely, (T7, T6, T5, T4, T3, T2, T1, T0)=(0, 0, 1, 1, 1, 1, 1, 1)), the output signals D3, D2, D1 and D0 become 0, 1, 1 and 0, respectively, (namely, (D3, D2, D1, D0)=(0, 1, 1, 0)). It is noted that "1" denotes the high-level signal, and "0" denotes the low-level signal.

The arithmetic circuit CL1 performs three-input binary addition and subtraction (S+D−A) where each input is of four bits. Namely, the arithmetic circuit CL1 adds the data signals inputted to D input terminals to those inputted to S input terminals, subtracts the data signals inputted to A terminals from the addition result, and then, outputs the operation result from O output terminals. The arithmetic circuit CL1 can be efficiently implemented by a carry-save adder or the like. The clock signal CLK1 is inputted to each of the bits A0 to A3 of the respective A input terminals. In this case, as shown in FIG. 10, the clock signal CLK1 is inverted to either 0 or 1 whenever the clock signal CLK of the sampling clock signal rises. That is, the minimum value of 000 and the maximum value of 111 are alternately inputted to each of the bits A0 to A3 of the respective A input terminals of the arithmetic circuit CL1 whenever the clock signal CLK rises. Further, the three-bit output signals from the O output terminals O0 to O2 of the arithmetic circuit CL1 are temporarily held and stored in the flip-flops FF0 to FF2, respectively. Thereafter, the output signals are fed back to the respective S input terminals S0 to S2 of the arithmetic circuit CL1, and are outputted to I input terminals (shift amount indication terminals) I0 to I2 of the barrel shifter BS1, respectively. It is noted that the most significant bit (MSB) S3 of the S input terminal of the arithmetic circuit CL1 is grounded and a zero signal is inputted thereto.

The barrel shifter BS1 is an eight-bit rotating counter-clockwise shifting circuit in a form of ring. The shift amount of the barrel shifter BS1 is designated by lower-order three bits I2, I1 and I0. Namely, after rotating the input signals so as to be shifted counterclockwise by the designated shift amount, the barrel shifter BS1 outputs the eight-bit shifted output signals to the DA converter DAC1. A predetermined high-level voltage is applied to the most significant bit (MSB) I3 of the I input terminal, and this leads to that the most significant bit (MSB) I3 is fixed to 1. The barrel shifter BS1 operates as follows. For example, when the input signals T7, T6, T5, T4, T3, T2, T1 and T0 are set to 0, 0, 0, 0, 0, 0, 1 and 1, respectively, (namely, (T7, T6, T5, T4, T3, T2, T1, T0)=(0, 0, 0, 0, 0, 0, 1, 1)) and shift amount signals I2, I1 and I0 are set to 0, 1 and 1, respectively, (namely, (I2, I1, I0)=(0, 1, 1)), the output signals O7, O6, O5, O4, O3, O2, O1 and O0 become 0, 0, 0, 1, 1, 0, 0 and 0, respectively, (namely, (O7, O6, O5, O4, O3, O2, O1, O0)=(0, 0, 0, 1, 1, 0, 0, 0)). In addition, when the input signals T7, T6, T5, T4, T3, T2, T1 and T0 are set to 0, 0, 0, 1, 1, 1, 1 and 1, respectively, (namely, (T7, T6, T5, T4, T3, T2, T1, T0)=(0, 0, 0, 1, 1, 1, 1, 1)) and shift amount signals I2, I1 and I0 are set to 1, 0 and 1, respectively, (namely, (I2, I1, I0)=(1, 0, 1)), the output signals O7, O6, O5, O4, O3, O2, O1 and O0 become 1, 1, 1, 0, 0, 0, 1 and 1, respectively, (namely, (O7, O6, O5, O4, O3, O2, O1, O0)=(1, 1, 1, 0, 0, 0, 1, 1)).

The DWA logic circuit DWA2 shown in FIG. 9 includes an encoder EN2, an arithmetic circuit CL2, a barrel shifter BS2, and three flip-flops FF10 to FF12 that are register circuits, in a manner similar to those of the DWA logic circuit DWA1 shown in FIG. 8. However, the DWA logic circuit DWA2 differs from the DWA logic circuit DWA1 in the following respects.

(A) When eight-bit digital output signals of a thermometer code inputted from the AD converter ADCQ are inputted to the encoder EN1 and the barrel shifter BS2, output signals from the barrel shifter BS2 are outputted to the DA converter DAC2.

(B) The arithmetic circuit CL2 performs 3-input binary addition and subtraction (A−(S+D)) where each input is of 4 bits. Namely, the arithmetic circuit CL2 subtracts the sum of the data signals inputted to S input terminals and those inputted to D input terminals from the data signals inputted to A input terminals, and then outputs the operation result from O output terminals. The clock signal CLK1 is inputted to a lowest bit A0 of the A input terminal whereas the higher-order bits A1 to A3 than the bit A0 are grounded and zero data signals are inputted thereto.

(C) The barrel shifter BS2 is an eight-bit rotating counterclockwise shifting and clockwise shifting circuit. When the most significant bit (MSB) I3 of the I input terminal is 1, the barrel shifter BS2 shifts the signal counterclockwise. When the most significant bit (MSB) I3 of the I input terminal is 0, the barrel shifter BS2 shifts the signal clockwise. A shift amount of the barrel shifter BS2 is designated by lower-order three bits I0 to I2 of the I input terminals. The clock signal CLK1 is inputted to the most significant bit (MSB) I3 of the input terminal so as to control the barrel shifter BS2 to selectively switch over between counterclockwise shifting and clockwise shifting whenever the sampling clock signal rises.

The details of operations performed by the DWA logic circuits DWA1 and DWA2 thus configured are disclosed and well-known in, for example, the Eighth Non-Patent Document. The DWA logic circuit DWA1 implements a complex digital filter provided at the previous stage of the DA converter DAC1 and a complex analog filter provided at the subsequent stage of the DA converter DAC1 using a well-known high-pass element rotation method on the digital signal from the AD converter ADCI. As a result, the DWA logic circuit DWA1 substantially performs the noise-shaping on the nonlinearity of the DA converter DAC1. In a manner similar to above, the DWA logic circuit DWA2 implements a complex digital filter provided at the previous stage of the DA converter DAC2 and a complex analog filter provided at the subsequent stage of the DA converter DAC2 using a well-known low-pass element rotation method on the digital signal from the AD converter ADCQ. As a result, the DWA logic circuit DWA2 substantially performs the noise-shaping on the nonlinearity of the DA converter DAC2. Thus, the complex band-pass $\Delta\Sigma$ AD modulator shown in FIG. 7 can execute a multi-bit complex band-pass $\Delta\Sigma$ AD modulation processing.

As apparent from FIG. 7, in a manner similar to that of FIG. 6, the complex band-pass $\Delta\Sigma$ AD modulator thus configured as shown in FIG. 7 can prevent signal lines of the two signals orthogonal to each other from crossing each other. In addition, the complex band-pass $\Delta\Sigma$ AD modulator according to the present preferred embodiment can prevent deterioration in the precision due to the mismatching in the element parameters between the two processing circuit parts that perform the two signals, respectively as described later in detail.

Modified Preferred Embodiment of Third Preferred Embodiment

In the present modified preferred embodiment, a method for reducing the deterioration in the signal-to-noise ratio (SNR) due to mismatching in the parameters between I and Q circuit parts will be described. With the circuit configuration shown in FIG. 7, the following equations (24) to (25) are satisfied for, for example, a digital signal N1(n).

In the case of $n=2k-1$, $N1(2k-1)=Q1(2k-1)$ (24), and

In the case of $n=2k$, $N1(2k)=I1(2k)$ (25).

Figure 11:
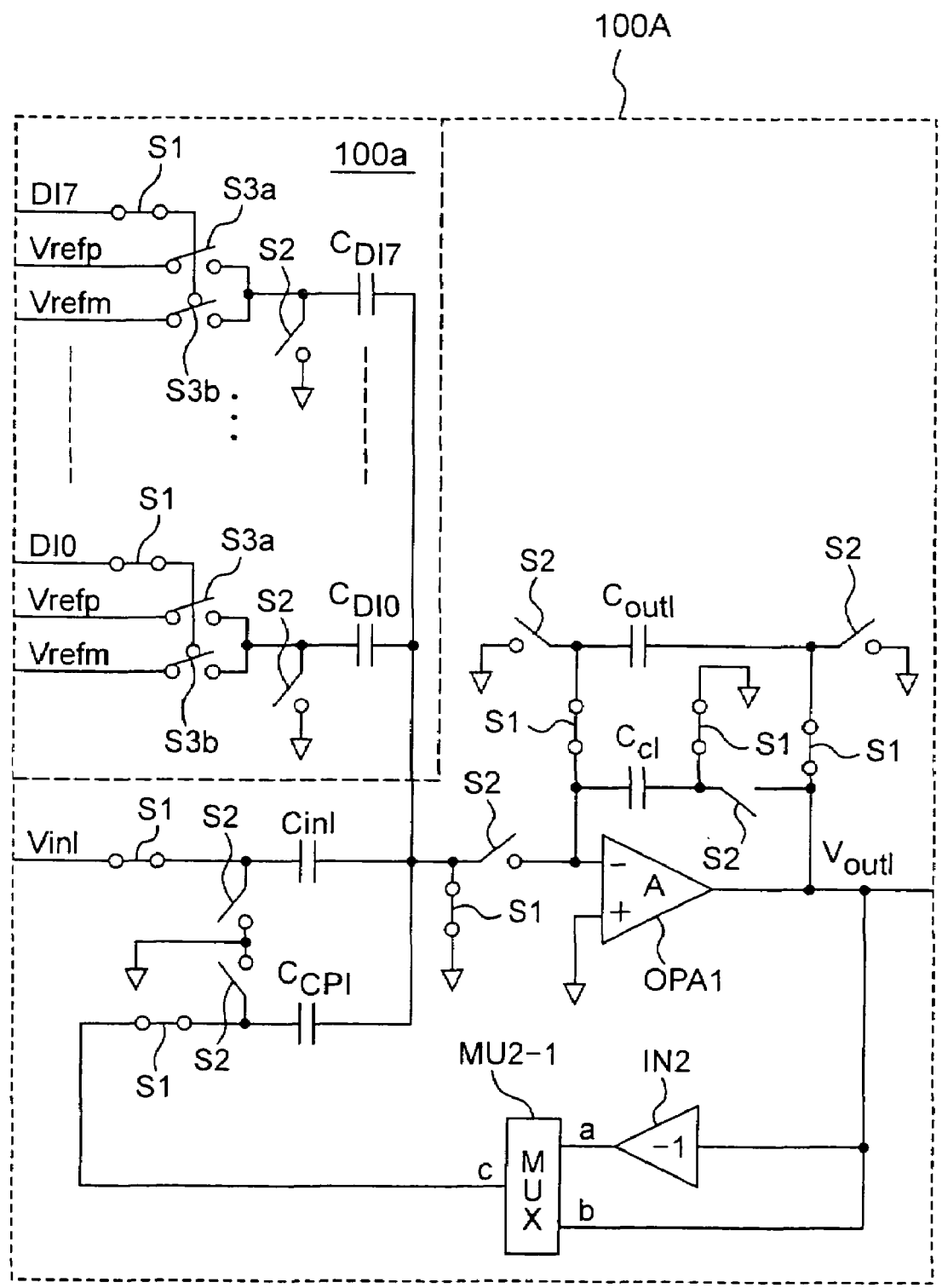
FIG. 11 is a circuit diagram showing a complex band-pass filter 100A shown in FIG. 7 when the filter 100A is expressed by a switched capacitor circuit.
Figure 12:
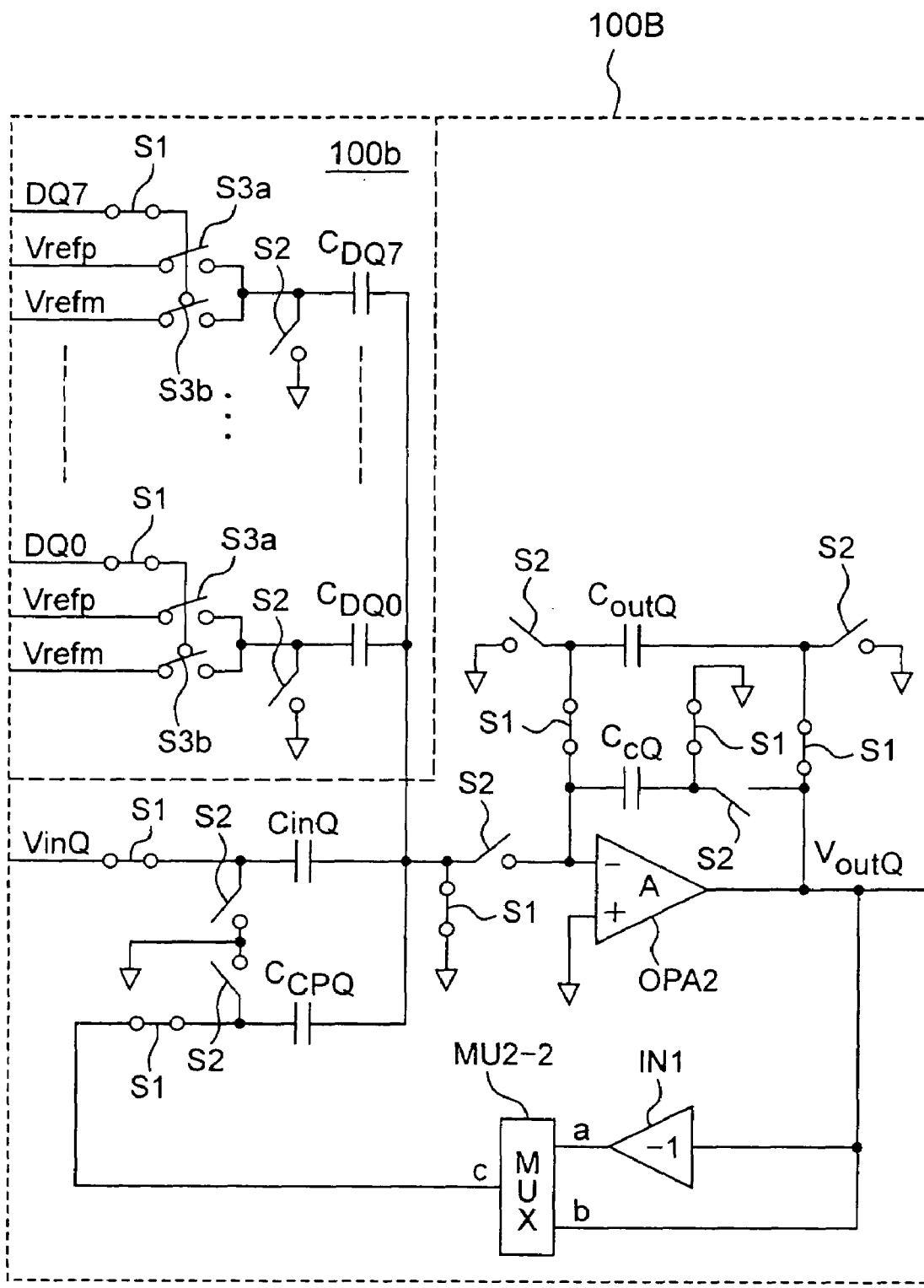
FIG. 12 is a circuit diagram showing a complex band-pass filter 100B shown in FIG. 7 when the filter 100B is expressed by a switched capacitor circuit.

Furthermore, in the case of n=2k−1, the AD converter ADC1 outputs an output signal Iout. In the case of n=2k, the AD converter ADC1 outputs an output signal Qout. Each of the DAC converters DAC1 to DAC4 is switched over between a DAC converter for the I circuit part or for the Q circuit part whenever the sampling clock rises. Such an operation can reduce the influence of the mismatching in the parameters between the I and Q circuit parts (or respective corresponding circuits of) of the modulator on the deterioration in the SNR. In addition to the configuration and operation of this block level, the influence of the mismatching can be reduced by dynamic matching of a circuit level. FIG. 11 (the I circuit part) and FIG. 12 (the Q circuit part) show circuit configurations of the complex band-pass filters using the method for implementing each of the delay circuits DE1 and DE2 by a switched capacitor (SC) circuit as disclosed in the Ninth Non-Patent Document. Namely, FIG. 11 is a circuit diagram of a complex band-pass filter 100A shown in FIG. 7 when the filter 100A is expressed by the SC circuit. FIG. 12 is a circuit diagram of a complex band-pass filter 100B shown in FIG. 7 when the filter 100A is expressed by the SC circuit.

Referring to FIG. 11, in a reference voltage generator 100a, a switch S3a is turned on and a switch S3b is turned off according to each of eight-bit data DI0 to DI7. $V_{refp}$ denotes a p-channel reference voltage, and $V_{refm}$ denotes a reference voltage at an intermediate voltage potential. In the SC circuit shown in FIG. 11, an I signal voltage $V_{inI}$ is inputted and an I signal voltage $V_{outI}$ is outputted. Further, $C_{DI0}$ to $C_{DI7}$ denote combining capacitors, and S1 and S2 denote switched capacitor operation switches that operate to be turned on and off in manners different from each other. $C_{inI}$ denotes a coupling capacitor for the inputted I signal, and $C_{CPI}$ denotes a capacitor of a feedback circuit. $C_{cI}$ denotes a capacitor of a feedback circuit of an operational amplifier OPA1, and $C_{outI}$ denotes a capacitor for deciding an output signal voltage. The symbol of each capacitor is used as a capacitance in the following equations (26) to (28).

Referring to FIG. 12, in a reference voltage generator 100$b$, a switch S3$a$ is turned on and a switch S3$b$ is turned off according to each of eight-bit data DQ0 to DQ7. $V_{refp}$ denotes a p-channel reference voltage, and $V_{refm}$ denotes a reference voltage at an intermediate voltage potential. In the SC circuit shown in FIG. 12, a Q signal voltage $V_{inQ}$ is inputted and a Q signal voltage $V_{outQ}$ is outputted. Further, $C_{DQ0}$ to $C_{DQ7}$ denote combining capacitors, and S1 and S2 denote switched capacitor operation switches that operate to be turned on and off in manners different from each other. $C_{inQ}$ denotes a coupling capacitor for the inputted Q signal, and $C_{CPQ}$ denotes a capacitor of a feedback circuit. $C_{cQ}$ denotes a capacitor of a feedback circuit of an operational amplifier OPA1, and $C_{outQ}$ denotes a capacitor for deciding an output signal voltage. The symbol of each capacitor is used as a capacitance in the following equations.

On the other hand, an ideal modulator free from mismatching in the element parameters between the I and Q circuit parts satisfies the following equations in FIG. 7.

$$C_{inI}/C_{outI} = C_{inQ}/C_{outQ}(= a_1), \qquad (26)$$

$$\frac{\sum_{n=0}^{7} C_{DIn}}{C_{outI}} = \frac{\sum_{n=0}^{7} C_{DQn}}{C_{outQ}}(= b_1), \text{ and} \qquad (27)$$

$$C_{CPI}/C_{CPQ} = C_{outI}/C_{outQ} \qquad (28)$$

Figure 13:
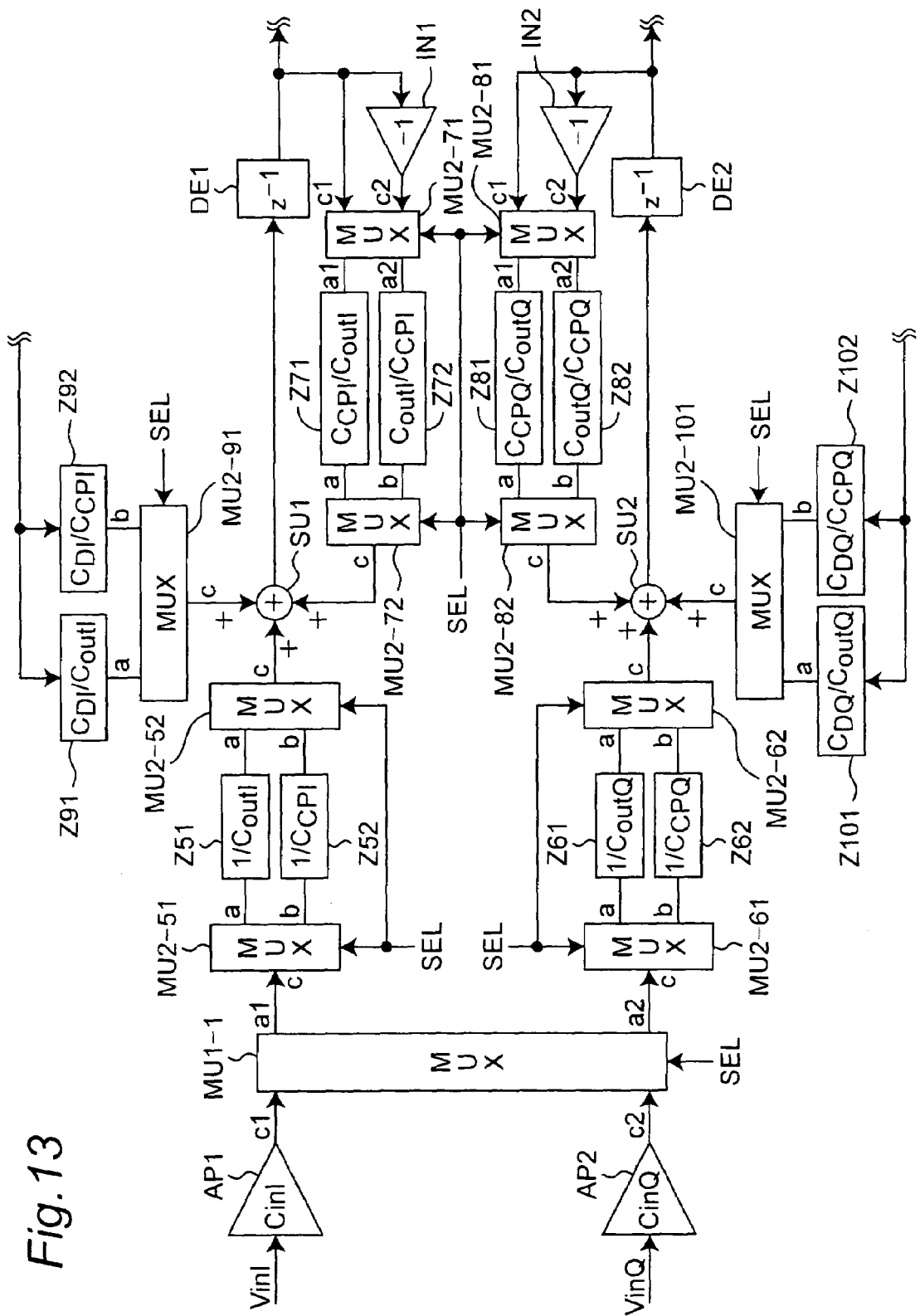
FIG. 13 is a circuit diagram showing an equivalent circuit for two complex band-pass filters for reducing the influence of mismatching in the capacitances between the complex band-pass filters 100A and 100B at the first stage of the multi-bit complex band-pass ΔΣ AD modulator 7A shown in FIG. 7.

The capacitance ratios of an actual modulator do not satisfy the equations (26) to (28) due to the variations on the element parameters by the manufacturing process. This leads to mismatching in the element parameters between the I and Q circuit parts of the modulator, resulting in deterioration in the precision of the entire modulator. Concretely speaking, this leads to deterioration in the SNR. In order to reduce the deterioration in SNR due to the mismatching in the element parameters (in particular, variations between the capacitances of capacitors) between the I and Q circuit parts, the complex digital filter 100A at the first stage of the modulator shown in FIG. 7 according to the third preferred embodiment is allowed to perform the following operation (See FIG. 13). FIG. 13 is a circuit diagram of an equivalent circuit of the two complex band-pass filters so as to reduce the influence of the mismatching in the capacitances on the complex band-pass filters 100A and 100B at the first stage of the modulator in FIG. 7. Referring to FIG. 13, Z51, Z52, Z61, Z62, Z71, Z72, Z81, Z82, Z91, Z92, Z101 and Z102 denote capacitive impedance circuits for switching over among the capacitances of the SC circuit for each clock signal CLK.

(1) The capacitor $C_{inI}$ of a multiplier AP1 and the capacitor $C_{inQ}$ of a multiplier AP2 are fixed to the I and Q circuit parts, respectively. The I signal Iin and the Q signal Qin are inputted to the operational amplifiers AP1 and AP2 via the capacitors $C_{inI}$ and $C_{inQ}$, respectively. Thereafter, the I and Q signals are alternately transmitted to the I and Q circuit parts by the multiplexer MU1-1. This is because simulation results show that the influence of the mismatching in the capacitors $C_{inI}$ and $C_{inQ}$ is small.

(2) The capacitors $C_{outI}$ and $C_{CPI}$ are alternately switched over based on the clock signal CLK by multiplexers MU2-51 and MU2-52 between which the capacitors $C_{outI}$ and $C_{CPI}$ are sandwiched. In addition, the capacitors $C_{outQ}$ and $C_{CPQ}$ are alternately switched over based on the clock signal CLK by multiplexers MU2-61 and MU2-62 between which the capacitors $C_{outQ}$ and $C_{CPQ}$ are sandwiched. This is intended to reduce the influence of the mismatching in the capacitances between the capacitors $C_{CPI}$ and $C_{CPQ}$ and that of the capacitors $C_{outI}$ and $C_{outQ}$.

In the SC circuit shown in FIG. 11 or 12, the capacitor $C_{outI}$ or $C_{outQ}$ of the feedback circuit of the operational amplifier for deciding the output signal voltage and the capacitor $C_{CPI}$ or $C_{CPQ}$ of the feedback circuit from the delay circuit DE1 or DE2 to the adder SU1 or SU2 are alternately replaced. This corresponds to switchover of the impedance circuit in three portions of either the I circuit part or the Q circuit part.

By thus configuring and operating, it is possible to further reduce the influence of the mismatching in the element parameters between the circuit parts. Since the influence of the mismatching in the element parameters between the I and Q circuit parts on the second-stage filter is small, the above-described configuration and operation are applied only to the first-stage complex digital filter.

The main concept of the modified preferred embodiment of the third preferred embodiment may be applied to the second preferred embodiment or the like.

FIRST IMPLEMENTAL EXAMPLE

In order to confirm the validity of the circuit according to the third preferred embodiment, the inventors of the present invention carried out simulations using a well-known MAT-LAB tool.

Figure 15:
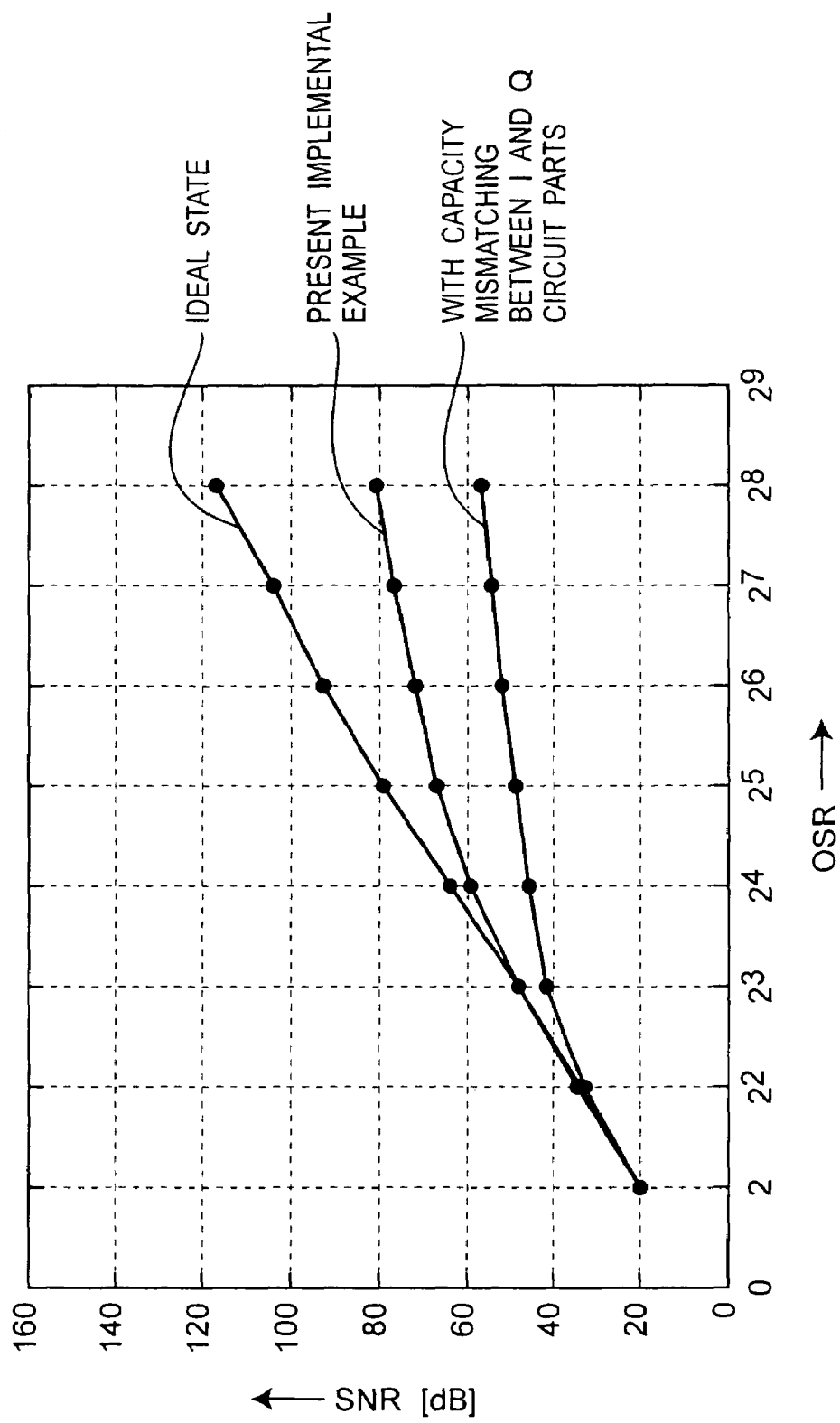
FIG. 15 is a graph showing a signal-to-noise ratio SNR relative to an oversampling rate (OSR) of the complex band-pass ΔΣ AD modulator for three cases according to the first implemental example.
Figure 16:
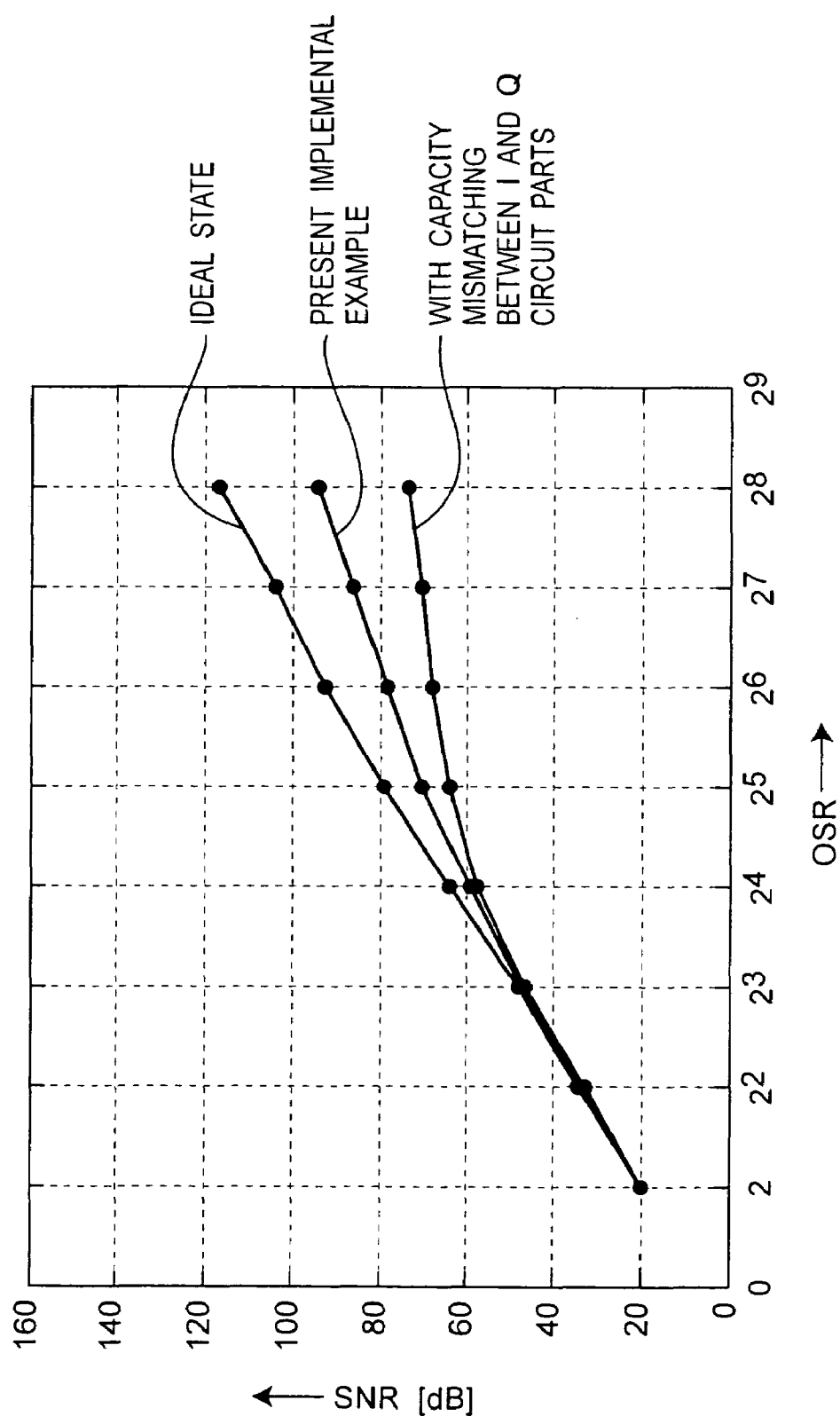
FIG. 16 is a graph showing a signal-to-noise ratio SNR relative to an oversampling rate (OSR) of the complex band-pass ΔΣ AD modulator for three cases according to the second implemental example.

(State 1) When the modulator is an ideal modulator without any mismatching in the element parameters between the I and Q circuit parts ("Ideal State" in FIGS. 15 and 16).

(State 2) When the modulator is a modulator with mismatching in the capacitance parameters between the I and Q circuit parts, and with internal three-bit DA converters each including nonlinearities ("With mismatching in the capacitances between I and Q circuit parts" in FIGS. 15 and 16).

(State 3) When the modulator has a circuit configuration of the modulator according to the third preferred embodiment although the mismatching is present in a manner similar to the above (State 2).

FIG. 15 is a graph of SNR to an oversampling rate (OSR) of the complex band-pass $\Delta\Sigma$ AD modulator for each of three cases according to the first implemental example. FIG. 18 is a table showing mismatching in the capacitance parameters between the I and Q circuit parts according to the second implemental example. As apparent from FIG. 15, the SNR of the ideal modulator increases according to an increase in the OSR. With the mismatching in the capacitances between the I and Q circuit parts (FIG. 17), the SNR saturates even with an increase in the OSR in the circuit according to the prior art. On the other hand, with the circuit configuration according to the present preferred embodiment, the SNR increases according to an increase in the OSR. This indicates that the influence of the mismatching in the capacitances between the I and Q circuit parts can be reduced.

SECOND IMPLEMENTAL EXAMPLE

FIG. 16 is a graph of a SNR relative to an OSR of the complex band-pass $\Delta\Sigma$ AD modulator for three cases according to the second implemental example. FIG. 17 is a table showing mismatching in the capacitance parameters between the I and Q circuit parts according to the first implemental example. In a manner similar to above, FIG. 16 shows a result of a case (FIG. 18) with only the mismatching in the capacitances between the I and Q circuit parts of the complex digital filter in the modulator utilizing an ideal DA converters. As apparent from FIG. 16, the SNR is improved as compared with that of the first implemental example. In particular with the circuit configuration according to the present preferred embodiment, the SNR is remarkably improved.

As described so far, according to the present preferred embodiments, the discrete-time complex band-pass ΔΣ AD modulator has the novel circuit configuration so as to be applied to a low-IF receiver for a mobile telephone, a radio LAN or Bluetooth. As compared with the prior arts, the analog multiplexer circuits are additionally provided, and this leads to that it is possible to suppress the deterioration in the SNR due to the mismatching in the element parameters between the I and Q circuit parts of the complex band-pass filter. In addition, it is possible to eliminate portions in which the signal lines cross each other between the I and Q circuit parts of the complex modulator, so as to completely separate the I circuit part from the Q circuit part. This can quite facilitate design of circuit configuration and layout.

Appendix 1.

In the Appendix 1, the deterioration in the precision due to the mismatching in the element parameters between the I and Q circuit parts of the complex band-pass ΔΣ AD modulator will be described.

Figure 14:
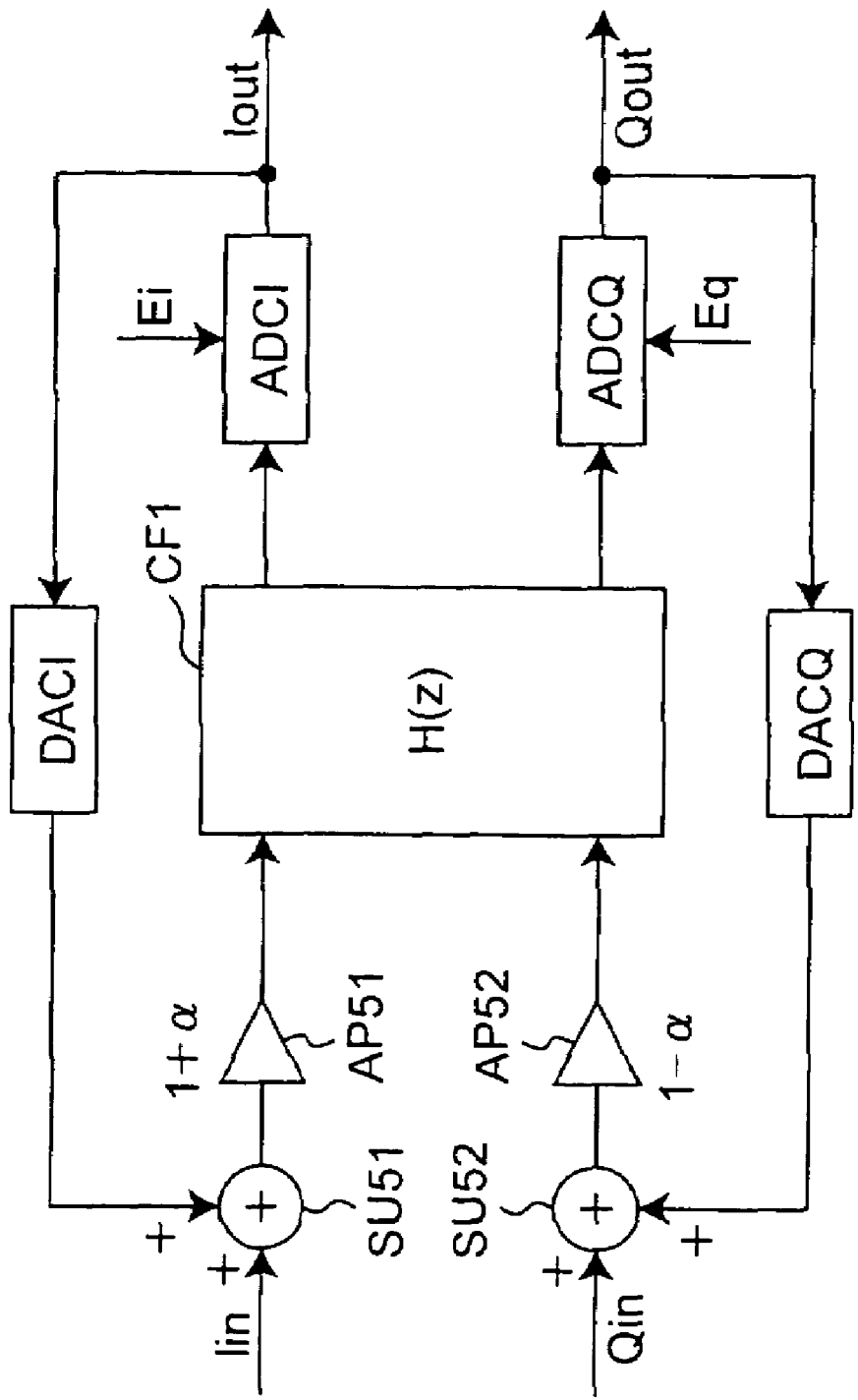
FIG. 14 is a block diagram showing a complex band-pass ΔΣ AD modulator showing a deterioration in the precision due to element parameter mismatching α between I and Q circuit parts of the complex band-pass ΔΣ AD modulator.

FIG. 14 is a block diagram of the complex band-pass ΔΣ AD modulator showing a deterioration in the precision due to the mismatching $\alpha$ in the element parameters between the I and Q circuit parts of the complex band-pass ΔΣ AD modulator. Referring to FIG. 14, the complex band-pass ΔΣ AD modulator includes two adders SU51 and SU52, two multipliers AP51 and AP52 each of an amplifier, respectively, a complex filter CF1 having a transfer function H(z), two AD converters ADCI and ADCQ, and two DA converters DACI and DACQ. The multiplier AP51 has a multiplication coefficient of $1+\alpha$, and the multiplier AP52 has a multiplication coefficient of $1-\alpha$. The reason for the deterioration in signal-to-noise ratio (SNR) due to the mismatching in the element parameters between the I and Q circuit parts will be considered based on the idea of a well-known complex signal processing (See, for example, the Fourteenth Non-Patent Document). In FIG. 14, when no mismatching in the element parameters is present ($\alpha=0$), the following relational equation is satisfied:

$$I_{out} + jQ_{out} = \frac{H}{1+H}(I_{in} + jQ_{in}) + \frac{1}{1+H}(E_i + jE_q).$$

On the other hand, with the mismatching in the element parameters ($\alpha \neq 0$), the following relational equation is satisfied:

$$I_{out} + jQ_{out} = \frac{H + (1-\alpha^2)H^2}{1 + 2H + (1-\alpha^2)H^2}(I_{in} + jQ_{in}) +$$
$$\frac{\alpha H}{1 + 2H + (1-\alpha^2)H^2}(I_{in} - jQ_{in}) +$$

-continued
$$\frac{1+H}{1+2H+(1-\alpha^2)H^2}(E_i + jE_q) +$$
$$\frac{\alpha H}{1+2H+(1-\alpha^2)H^2}(E_i - jE_q).$$

In the latter case, it is recognized that the quantization noise in the image band ($E_i - jE_q$) enters the signal band, and this leads to deterioration in the SNR. The transfer function for this case is represented by the following equation based on the above equation:

$$\frac{\alpha H}{1 + 2H + (1-\alpha^2)H^2}.$$

INDUSTRIAL APPLICABILITY

As described so far in detail, the complex band-pass filer, the complex band-pass ΔΣ AD modulator, the AD converter circuit, and the digital radio receiver according to the present invention can prevent two signal lines orthogonal to each other from crossing each other, and can prevent deterioration in the precision due to the mismatching in the element parameters between the I and Q circuit parts.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A complex band-pass filter comprising first and second circuit parts for executing at least first-order complex band-pass filtering processing on an inputted complex signal including first and second signals orthogonal to each other respectively to output a filtered complex signal including third and fourth signals orthogonal to each other,
   wherein the first circuit part comprises:
   a first adder for adding the first signal to an output signal from a first multiplexer, and outputting an addition result signal;
   a first delay device for delaying the addition result signal from the first adder by a predetermined time interval, and outputting a delayed output signal;
   a first inverter for changing a sign of the output signal from the first delay device, and outputting an output signal having a changed sign; and
   the first multiplexer for selecting the output signal from the first inverter and outputting the selected output signal to the first adder for a first time interval out of the first and second time intervals different from each other and alternately occurring, and for adding the output signal from the first delay device to the first adder for the second time interval,
   wherein the second circuit part comprises:
   a second adder for adding the second signal to an output signal from a second multiplexer, and outputting an addition result signal;

a second delay device for delaying the addition result signal from the second adder by a predetermined further time interval, and outputting a delayed output signal;

a second inverter for changing a sign of the output signal from the second delay device, and outputting an output signal having a changed sign; and the second multiplexer for outputting the output signal from the second delay device to the second adder for first time interval, and for selecting the output signal from the second inverter and outputting the selected output signal to the second adder for the second time interval, and wherein the complex band-pass filter comprises:

a third multiplexer for outputting the first signal to the first adder and outputting the second signal to the second adder for the first time interval, and for outputting the first signal to the second adder and outputting the second signal to the first adder for the second time interval; and a fourth multiplexer for outputting the output signal from the first delay device as the third signal and outputting the output signal from the second delay signal as the fourth signal for the first time interval, and for outputting the output signal from the first delay device as the fourth signal and outputting the output signal from the second delay signal as the third signal for the second time interval.

2. The complex band-pass filter as claimed in claim 1, wherein the complex band-pass filter is constituted by a switched capacitor circuit including an operational amplifier, and wherein the complex band-pass filter further comprises a fifth multiplexer, according to one of the first and second time intervals, for alternately switching over between (a) a capacitor of a feedback circuit of an operational amplifier for deciding an output signal voltage, and (b) a further capacitor of a feedback signal circuit from one of the first and second delay devices to one of the first and second adders.

3. A complex band-pass $\Delta\Sigma$ AD modulator comprising a complex band-pass filter, said complex band-pass filter including first and second circuit parts for executing at least first-order complex band-pass filtering processing on an inputted complex signal including first and second signals orthogonal to each other respectively to output a filtered complex signal including third and fourth signals orthogonal to each other, wherein the first circuit part comprises:

a first adder for adding the first signal to an output signal from a first multiplexer, and outputting an addition result signal;

a first delay device for delaying the addition result signal from the first adder by a predetermined time interval, and outputting a delayed output signal;

a first inverter for changing a sign of the output signal from the first delay device, and outputting an output signal having a changed sign; and the first multiplexer for selecting the output signal from the first inverter and outputting the selected output signal to the first adder for a first time interval out of the first and second time intervals different from each other and alternately occurring, and for adding the output signal from the first delay device to the first adder for the second time interval, wherein the second circuit part comprises:

a second adder for adding the second signal to an output signal from a second multiplexer, and outputting an addition result signal;

a second delay device for delaying the addition result signal from the second adder by a predetermined further time interval, and outputting a delayed output signal;

a second inverter for changing a sign of the output signal from the second delay device, and outputting an output signal having a changed sign; and the second multiplexer for outputting the output signal from the second delay device to the second adder for first time interval, and for selecting the output signal from the second inverter and outputting the selected output signal to the second adder for the second time interval, wherein the complex band-pass filter comprises:

a third multiplexer for outputting the first signal to the first adder and outputting the second signal to the second adder for the first time interval, and for outputting the first signal to the second adder and outputting the second signal to the first adder for the second time interval; and a fourth multiplexer for outputting the output signal from the first delay device as the third signal and outputting the output signal from the second delay signal as the fourth signal for the first time interval, and for outputting the output signal from the first delay device as the fourth signal and outputting the output signal from the second delay signal as the third signal for the second time interval, and wherein the complex band-pass $\Delta\Sigma$ AD modulator further comprises:

first and second AD converters, provided at the previous stage of the fourth multiplexer, for converting the output signal from the first delay device and the output signal from the second delay device into a complex digital signal including third and fourth digital signals orthogonal to each other, respectively;

a first DA converter for converting the third digital signal from the first AD converter into an analog signal, and outputting the analog signal to the first adder; and a second DA converter for converting the fourth digital signal from the second AD converter into a further analog signal, and for outputting the further analog signal to the second adder.

4. The complex band-pass $\Delta\Sigma$ AD modulator as claimed in claim 3, wherein the complex band-pass filter is constituted by a switched capacitor circuit including an operational amplifier, and wherein the complex band-pass filter further comprises a fifth multiplexer, according to one of the first and second time intervals, for alternately switching over between (a) a capacitor of a feedback circuit of an operational amplifier for deciding an output signal voltage, and (b) a further capacitor of a feedback signal circuit from one of the first and second delay devices to one of the first and second adders.

5. The complex band-pass $\Delta\Sigma$ AD modulator as claimed in claim 3, further comprising:

a first logic circuit, provided between the first AD converter and the first DA converter, for substantially performing noise-shaping on nonlinearity of the first DA converter by implementing a complex digital filter provided at the previous stage of the first DA converter and a complex digital filter provided at the subsequent stage of the first DA converter, using a high-pass element rotation method on the third digital signal from the first AD converter; and a second logic circuit, provided between the second AD converter and the second DA converter, for substantially performing noise-shaping on nonlinearity of the second DA converter by implementing a complex digital filter provided at the previous stage of the second DA converter and a complex digital filter provided at the subsequent stage of the second DA converter, using a low-pass element rotation method on the fourth digital signal from the second AD converter, wherein the complex band-pass ΔΣ AD modulator executes a complex band-pass ΔΣ AD modulation processing of multiple bits.

6. The complex band-pass ΔΣ AD modulator as claimed in claim 4, further comprising:

a first logic circuit, provided between the first AD converter and the first DA converter, for substantially performing noise-shaping on nonlinearity of the first DA converter by implementing a complex digital filter provided at the previous stage of the first DA converter and a complex digital filter provided at the subsequent stage of the first DA converter, using a high-pass element rotation method on the third digital signal from the first AD converter; and a second logic circuit, provided between the second AD converter and the second DA converter, for substantially performing noise-shaping on nonlinearity of the second DA converter by implementing a complex digital filter provided at the previous stage of the second DA converter and a complex digital filter provided at the subsequent stage of the second DA converter, using a low-pass element rotation method on the fourth digital signal from the second AD converter, wherein the complex band-pass ΔΣ AD modulator executes a complex band-pass ΔΣ AD modulation processing of multiple bits.

7. The complex band-pass ΔΣ AD modulator as claimed in claim 5, wherein each of the first and second logic circuits includes:

an arithmetic circuit for executing a predetermined operation on the input digital signal; and a barrel shifter for shifting the inputted digital signal by a shift amount calculated by the arithmetic circuit.

8. The complex band-pass ΔΣ AD modulator as claimed in claim 6, wherein each of the first and second logic circuits includes:

an arithmetic circuit for executing a predetermined operation on the input digital signal; and a barrel shifter for shifting the inputted digital signal by a shift amount calculated by the arithmetic circuit.

9. An AD converter circuit comprising:

a complex band-pass ΔΣ AD modulator; and a decimation circuit for executing predetermined decimation processing on a digital signal outputted from the complex band-pass ΔΣ AD modulator to perform a digital complex band-pass filtering, wherein said complex band-pass ΔΣ AD modulator comprises a complex band-pass filter, said complex band-pass filter including first and second circuit parts for executing at least first-order complex band-pass filtering processing on an inputted complex signal including first and second signals orthogonal to each other respectively to output a filtered complex signal including third and fourth signals orthogonal to each other, wherein the first circuit part comprises:

a first adder for adding the first signal to an output signal from a first multiplexer, and outputting an addition result signal;

a first delay device for delaying the addition result signal from the first adder by a predetermined time interval, and outputting a delayed output signal;

a first inverter for changing a sign of the output signal from the first delay device, and outputting an output signal having a changed sign; and the first multiplexer for selecting the output signal from the first inverter and outputting the selected output signal to the first adder for a first time interval out of the first and second time intervals different from each other and alternately occurring, and for adding the output signal from the first delay device to the first adder for the second time interval, wherein the second circuit part comprises:

a second adder for adding the second signal to an output signal from a second multiplexer, and outputting an addition result signal;

a second delay device for delaying the addition result signal from the second adder by a predetermined further time interval, and outputting a delayed output signal;

a second inverter for changing a sign of the output signal from the second delay device, and outputting an output signal having a changed sign; and the second multiplexer for outputting the output signal from the second delay device to the second adder for first time interval, and for selecting the output signal from the second inverter and outputting the selected output signal to the second adder for the second time interval, wherein the complex band-pass filter comprises:

a third multiplexer for outputting the first signal to the first adder and outputting the second signal to the second adder for the first time interval, and for outputting the first signal to the second adder and outputting the second signal to the first adder for the second time interval; and a fourth multiplexer for outputting the output signal from the first delay device as the third signal and outputting the output signal from the second delay signal as the fourth signal for the first time interval, and for outputting the output signal from the first delay device as the fourth signal and outputting the output signal from the second delay signal as the third signal for the second time interval, and wherein the complex band-pass ΔΣ AD modulator further comprises:

first and second AD converters, provided at the previous stage of the fourth multiplexer, for converting the output signal from the first delay device and the output signal from the second delay device into a complex digital signal including third and fourth digital signals orthogonal to each other, respectively;

a first DA converter for converting the third digital signal from the first AD converter into an analog signal, and outputting the analog signal to the first adder; and a second DA converter for converting the fourth digital signal from the second AD converter into a further analog signal, and for outputting the further analog signal to the second adder.

10. The AD converter circuit as claimed in claim 9,
wherein the complex band-pass filter is constituted by a switched capacitor circuit including an operational amplifier, and
wherein the complex band-pass filter further comprises a fifth multiplexer, according to one of the first and second time intervals, for alternately switching over between (a) a capacitor of a feedback circuit of an operational amplifier for deciding an output signal voltage, and (b) a further capacitor of a feedback signal circuit from one of the first and second delay devices to one of the first and second adders.

11. The AD converter circuit as claimed in claim 9, further comprising:
a first logic circuit, provided between the first AD converter and the first DA converter, for substantially performing noise-shaping on nonlinearity of the first DA converter by implementing a complex digital filter provided at the previous stage of the first DA converter and a complex digital filter provided at the subsequent stage of the first DA converter, using a high-pass element rotation method on the third digital signal from the first AD converter; and
a second logic circuit, provided between the second AD converter and the second DA converter, for substantially performing noise-shaping on nonlinearity of the second DA converter by implementing a complex digital filter provided at the previous stage of the second DA converter and a complex digital filter provided at the subsequent stage of the second DA converter, using a low-pass element rotation method on the fourth digital signal from the second AD converter,
wherein the complex band-pass $\Delta\Sigma$ AD modulator executes a complex band-pass $\Delta\Sigma$ AD modulation processing of multiple bits.

12. The AD converter circuit as claimed in claim 10, further comprising:
a first logic circuit, provided between the first AD converter and the first DA converter, for substantially performing noise-shaping on nonlinearity of the first DA converter by implementing a complex digital filter provided at the previous stage of the first DA converter and a complex digital filter provided at the subsequent stage of the first DA converter, using a high-pass element rotation method on the third digital signal from the first AD converter; and
a second logic circuit, provided between the second AD converter and the second DA converter, for substantially performing noise-shaping on nonlinearity of the second DA converter by implementing a complex digital filter provided at the previous stage of the second DA converter and a complex digital filter provided at the subsequent stage of the second DA converter, using a low-pass element rotation method on the fourth digital signal from the second AD converter,
wherein the complex band-pass $\Delta\Sigma$ AD modulator executes a complex band-pass $\Delta\Sigma$ AD modulation processing of multiple bits.

13. The AD converter circuit as claimed in claim 11,
wherein each of the first and second logic circuits includes:
an arithmetic circuit for executing a predetermined operation on the input digital signal; and
a barrel shifter for shifting the inputted digital signal by a shift amount calculated by the arithmetic circuit.

14. The AD converter circuit as claimed in claim 12,
wherein each of the first and second logic circuits includes:
an arithmetic circuit for executing a predetermined operation on the input digital signal; and
a barrel shifter for shifting the inputted digital signal by a shift amount calculated by the arithmetic circuit.

15. A digital radio receiver for receiving an analog radio signal and outputting a received digital signal, said digital radio receiver comprising an AD converter circuit,
wherein said AD converter circuit comprising:
a complex band-pass $\Delta\Sigma$ AD modulator; and
a decimation circuit for executing predetermined decimation processing on a digital signal outputted from the complex band-pass $\Delta\Sigma$ AD modulator to perform a digital complex band-pass filtering,
wherein said complex band-pass $\Delta\Sigma$ AD modulator comprises a complex band-pass filter, said complex band-pass filter including first and second circuit parts for executing at least first-order complex band-pass filtering processing on an inputted complex signal including first and second signals orthogonal to each other respectively to output a filtered complex signal including third and fourth signals orthogonal to each other,
wherein the first circuit part comprises:
a first adder for adding the first signal to an output signal from a first multiplexer, and outputting an addition result signal;
a first delay device for delaying the addition result signal from the first adder by a predetermined time interval, and outputting a delayed output signal;
a first inverter for changing a sign of the output signal from the first delay device, and outputting an output signal having a changed sign; and
the first multiplexer for selecting the output signal from the first inverter and outputting the selected output signal to the first adder for a first time interval out of the first and second time intervals different from each other and alternately occurring, and for adding the output signal from the first delay device to the first adder for the second time interval,
wherein the second circuit part comprises:
a second adder for adding the second signal to an output signal from a second multiplexer, and outputting an addition result signal;
a second delay device for delaying the addition result signal from the second adder by a predetermined further time interval, and outputting a delayed output signal;
a second inverter for changing a sign of the output signal from the second delay device, and outputting an output signal having a changed sign; and
the second multiplexer for outputting the output signal from the second delay device to the second adder for first time interval, and for selecting the output signal from the second inverter and outputting the selected output signal to the second adder for the second time interval,
wherein the complex band-pass filter comprises:
a third multiplexer for outputting the first signal to the first adder and outputting the second signal to the second adder for the first time interval, and for outputting the first signal to the second adder and outputting the second signal to the first adder for the second time interval; and
a fourth multiplexer for outputting the output signal from the first delay device as the third signal and outputting the output signal from the second delay signal as the fourth signal for the first time interval, and for outputting the output signal from the first delay device as the fourth signal and outputting the output signal from the second delay signal as the third signal for the second time interval, and wherein the complex band-pass ΔΣ AD modulator further comprises:

first and second AD converters, provided at the previous stage of the fourth multiplexer, for converting the output signal from the first delay device and the output signal from the second delay device into a complex digital signal including third and fourth digital signals orthogonal to each other, respectively;

a first DA converter for converting the third digital signal from the first AD converter into an analog signal, and outputting the analog signal to the first adder; and a second DA converter for converting the fourth digital signal from the second AD converter into a further analog signal, and for outputting the further analog signal to the second adder.

16. The digital radio receiver as claimed in claim 15, wherein the complex band-pass filter is constituted by a switched capacitor circuit including an operational amplifier, and wherein the complex band-pass filter further comprises a fifth multiplexer, according to one of the first and second time intervals, for alternately switching over between (a) a capacitor of a feedback circuit of an operational amplifier for deciding an output signal voltage, and (b) a further capacitor of a feedback signal circuit from one of the first and second delay devices to one of the first and second adders.

17. The digital radio receiver as claimed in claim 15, further comprising:

a first logic circuit, provided between the first AD converter and the first DA converter, for substantially performing noise-shaping on nonlinearity of the first DA converter by implementing a complex digital filter provided at the previous stage of the first DA converter and a complex digital filter provided at the subsequent stage of the first DA converter, using a high-pass element rotation method on the third digital signal from the first AD converter; and a second logic circuit, provided between the second AD converter and the second DA converter, for substantially performing noise-shaping on nonlinearity of the second DA converter by implementing a complex digital filter provided at the previous stage of the second DA converter and a complex digital filter provided at the subsequent stage of the second DA converter, using a low-pass element rotation method on the fourth digital signal from the second AD converter, wherein the complex band-pass ΔΣ AD modulator executes a complex band-pass ΔΣ AD modulation processing of multiple bits.

18. The digital radio receiver as claimed in claim 16, further comprising:

a first logic circuit, provided between the first AD converter and the first DA converter, for substantially performing noise-shaping on nonlinearity of the first DA converter by implementing a complex digital filter provided at the previous stage of the first DA converter and a complex digital filter provided at the subsequent stage of the first DA converter, using a high-pass element rotation method on the third digital signal from the first AD converter; and a second logic circuit, provided between the second AD converter and the second DA converter, for substantially performing noise-shaping on nonlinearity of the second DA converter by implementing a complex digital filter provided at the previous stage of the second DA converter and a complex digital filter provided at the subsequent stage of the second DA converter, using a low-pass element rotation method on the fourth digital signal from the second AD converter, wherein the complex band-pass ΔΣ AD modulator executes a complex band-pass ΔΣ AD modulation processing of multiple bits.

19. The digital radio receiver as claimed in claim 17, wherein each of the first and second logic circuits includes:

an arithmetic circuit for executing a predetermined operation on the input digital signal; and a barrel shifter for shifting the inputted digital signal by a shift amount calculated by the arithmetic circuit.

20. The AD converter circuit as claimed in claim 18, wherein each of the first and second logic circuits includes:

an arithmetic circuit for executing a predetermined operation on the input digital signal; and a barrel shifter for shifting the inputted digital signal by a shift amount calculated by the arithmetic circuit.

* * * * *